United States Patent
Sugiyama et al.

[11] Patent Number: 5,939,152
[45] Date of Patent: *Aug. 17, 1999

[54] METHOD OF FORMING HARD CARBON FILM OVER THE INNER SURFACE OF GUIDE BUSH

[75] Inventors: Osamu Sugiyama, Tokorozawa; Yukio Miya, Kawagoe; Ryota Koike, Tokorozawa; Takashi Toida, Tokyo; Toshiichi Sekine, Kamifukuoka, all of Japan

[73] Assignee: Citizen Watch Co., Ltd., Tokyo, Japan

[*] Notice: This patent is subject to a terminal disclaimer.

[21] Appl. No.: 08/911,048

[22] Filed: Aug. 14, 1997

[30] Foreign Application Priority Data

Aug. 19, 1996 [JP] Japan .................................... 8-217352
Feb. 7, 1997 [JP] Japan .................................... 9-024584

[51] Int. Cl.$^6$ ............................... B05D 3/06; B05D 7/22; C23C 16/26; B23B 13/02
[52] U.S. Cl. ......................... 427/577; 427/237; 427/238; 427/239; 427/255.7; 427/249
[58] Field of Search ..................... 427/577, 237, 427/238, 239, 249, 255.7

[56] References Cited

FOREIGN PATENT DOCUMENTS 4-141303  5/1992  Japan .
8-131148  1/1996  Japan .
9-038801  2/1997  Japan .
9-038802  2/1997  Japan .

*Primary Examiner*—Roy V. King
*Attorney, Agent, or Firm*—Armstrong, Westerman, Hattori, McLeland & Naughton

[57] ABSTRACT

A hard carbon film is formed in a vacuum vessel directly or through an intermediate layer for enhancing adhesion over an inner surface of a guide bush with a uniform thickness and excellent adhesion wherein the inner surface is in sliding contact with a workpiece and the guide bush is mounted on an automatic lathe for holding the workpiece rotatably and slidably in the axial direction near a cutting tool. Accordingly, the method comprises disposing the guide bush in a vacuum vessel, inserting an auxiliary electrode into the center bore forming the inner surface of the guide bush to be at a ground potential, introducing a gas containing carbon into the vacuum vessel through the gas inlet port after evacuating the vacuum vessel, and applying a DC voltage to the guide bush through a reactor, thereby producing a plasma in the vacuum vessel so that a hard carbon film of hydrogenated amorphous carbon is formed over the inner surface of the guide bush by a plasma CVD method.

16 Claims, 18 Drawing Sheets

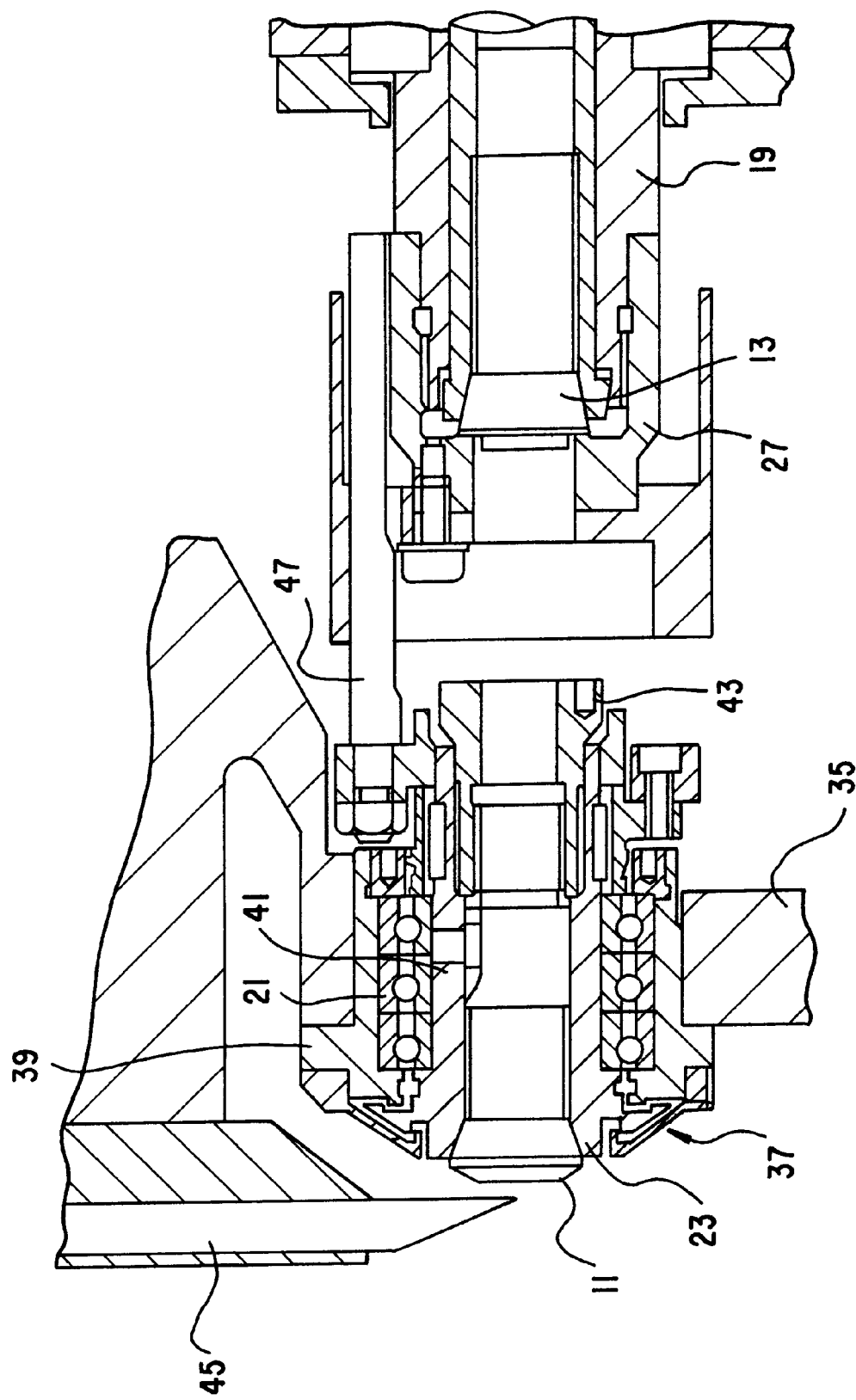

METHOD OF FORMING HARD CARBON FILM OVER THE INNER SURFACE OF GUIDE BUSH

BACKGROUND OF THE INVENTION

1. Field of the Invention

The present invention relates to a method of forming a hard carbon film over the inner surface of a guide bush to be in sliding contact with a rodlike workpiece, wherein the guide bush is mounted on an automatic lathe to support the workpiece for rotation and axial sliding at a position near a cutting tool (cutter).

2. Description of the Related Art

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a taper outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

A guide bush proposed in JP-A No. 4-141303 has an inner surface to be in sliding contact with a workpiece, which slides and rotates on the inner surface, attached with a cemented carbide (super hard alloy sleeve) or a ceramic material attached to the inner surface by brazing or the like.

When the inner surface of a guide bush is attached with a cemented carbide or a ceramic material excellent in wear resistance and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametral clearance between the guide bush and the workpiece even if the inner surface of the guide bush is attached with a cemented carbide or a ceramic material, because the cemented carbide and the ceramic material have comparatively a large coefficient of friction and a low thermal conductivity. Therefore, it has been difficult to increase the depth of cut and cutting speed.

The stationary guide bush has advantages in that a workpiece can be accurately machined in a high roundness because the workpiece can be held so that its axis may not run out, less noise is generated, and the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

To solve this problem, we propose a guide bush provided with a hard carbon film over an inner surface thereof which is in sliding contact with a work piece, thereby drastically enhancing wear resistance on the inner surface and capable of increasing depth of cut and cutting speed without damaging the workpiece and generating seizing.

The hard carbon film is formed of a hydrogenated amorphous carbon closely resembling diamond in properties. Therefore, hydrogenated amorphous carbon is also called diamondlike carbon (DLC).

The hard carbon film (DLC film) has a high hardness (not lower than Vickers 3000 Hv), is excellent in wear resistance and corrosion resistance, and has a small coefficient of friction (about ⅛ that of a cemented carbide).

As a method of forming a hard carbon film over the inner surface of the guide bush, there is a plasma CVD method (Plasma Chemical Vapor Deposition Process) consisting of forming the hard carbon film by reducing the pressure to $5 \times 10^{-3}$ torr adapted for forming the film in an atmosphere of a gas containing carbon, and applying a DC voltage of $-3$ kV from a DC power source to the guide bush to produce a plasma.

However in this plasma CVD method, since the gas containing carbon is decomposed to form the hard carbon film mainly using the plasma produced at the peripheral region of the guide bush, the hard carbon film can be uniformly formed over the outer surface of the guide bush but there is a problem in that the hard carbon film formed over the inner surface of the guide bush is inferior in adhesion, and the quality of the film with respect to, e.g., hardness is deteriorated.

This is caused by the fact that since there is a space in the center bore of the guide bush where electrodes of the same potential oppose each other, the plasma in the center bore generates an abnormal discharge called a hollow cathode discharge. The hard carbon film formed by the hollow cathode discharge is a polymeric film which is inferior in adhesion and is liable to be peeled off from the inner surface of the guide bush, and is low in hardness.

Further, in the method of forming the hard carbon film, a DC voltage of $-3$ kV is applied from a DC power source 73 to the guide bush 11 at $5 \times 10^{-3}$ torr which is the pressure for forming the hard carbon film.

In a state where pressure in the vacuum vessel is about $5 \times 10^{-3}$ torr, there are many electric charges such as electrons in the vacuum vessel interior, which makes the space impedance low. Accordingly, at the instant when the plasma discharge starts, an arc discharge which is an abnormal discharge is liable to occur in the guide bush.

Further, the time when the plasma discharge starts is the time when the hard carbon film is first formed, and hence the adhesion to the guide bush is influenced by the quality of the film formed at the first stage.

Accordingly, when arc discharge as abnormal discharge occurs at the first stage of the plasma discharge, the quality and adhesion of the hard carbon film are respectively deteriorated, which causes a problem that the hard carbon film peels off from the inner surface of the guide bush.

Accordingly, the present invention solves these problems, and it is an object of the invention to provide a guide bush provided with a hard carbon film, which is excellent in quality and adhesion, formed over the inner surface thereof which is in sliding contact with a workpiece.

SUMMARY OF THE INVENTION

To achieve the above object, the guide bush according to the present invention is formed substantially in a cylindrical shape and having a center bore in its axial direction, further including a taper outer surface, an inner surface to be in sliding contact with a workpiece, and slits provided at one end thereof, and it holds the workpiece inserted into the center bore rotatably and slidably in the axial direction near a cutting tool when the guide bush is mounted on an automatic lathe, wherein the hard carbon film is formed over the inner surface by the following processes.

The guide bush is disposed in a vacuum vessel provided with a gas inlet port, an evacuation port, an anode and a filament, and an auxiliary electrode is inserted into a center bore forming an inner surface of the guide bush and is at a ground potential.

After the vacuum vessel is evacuated, a gas containing carbon is introduced into the vacuum vessel through the gas inlet, and a DC voltage is applied to the guide bush through a reactor, while a DC voltage is applied to the anode and an AC voltage is applied to the filament, thereby producing a plasma in the vacuum vessel so that the hard carbon film is formed over the inner surface of the guide bush by a plasma CVD method.

As another method of producing a plasma in the vacuum vessel, a plasma may be produced by applying a DC voltage to the guide bush through a reactor without providing an anode and a filament in the vacuum vessel.

It is also possible to form the hard carbon film at the same time over inner surfaces of a plurality of guide bushes in a single vacuum vessel by disposing a plurality of guide bushes in the vacuum vessel, inserting auxiliary electrodes into each guide bush, applying a DC voltage to each guide bush through reactors to produce a plasma in the vacuum vessel.

In this case, the DC voltage may be applied to each of the plurality of guide bushes through a single reactor or the DC voltage may be applied to the guide bushes through individual reactors from individual DC power sources or a common DC power source.

In such a manner, when the DC voltage is applied to the guide bush through the reactor to produce a plasma in the vacuum vessel, an arc discharge as an abnormal discharge does not occur at the first stage of forming the film which influences the quality of the hard carbon film over the inner surface of the guide bush, thereby forming a hard carbon film which is excellent in quality and adhesion.

Further, it is possible to form the hard carbon film quickly over the inner surface of the guide bush with uniform thickness extending from the open end to the inner portion of the inner surface by introducing a gas containing carbon in the vacuum vessel to produce a plasma in a state where the auxiliary electrode at a ground potential is inserted into the center bore of the guide bush.

Still further, it is preferable that the hard carbon film be formed by the foregoing method after an intermediate layer is formed over the inner surface of the guide bush for enhancing the adhesion thereof.

The above and other objects, features and advantages of the invention will be apparent from the following detailed description which is to be read in conjunction with the accompanying drawings.

BRIEF DESCRIPTION OF THE DRAWINGS

FIG. 24 is a sectional view of only a spindle and associated parts included in an automatic lathe provided with a rotary guide bush unit employing a guide bush to which the present invention is applied.

DETAILED DESCRIPTION OF THE PREFERRED EMBODIMENTS

Preferred embodiments of the present invention will be described hereinafter.

Automatic Lathe Employing Guide Bush to which the Present Invention is applied

The construction of an automatic lathe which employs a guide bush provided with a hard carbon film formed over the inner surface thereof which is in sliding contact with a workpiece in accordance with the present invention will be briefly described.

Figure 23:
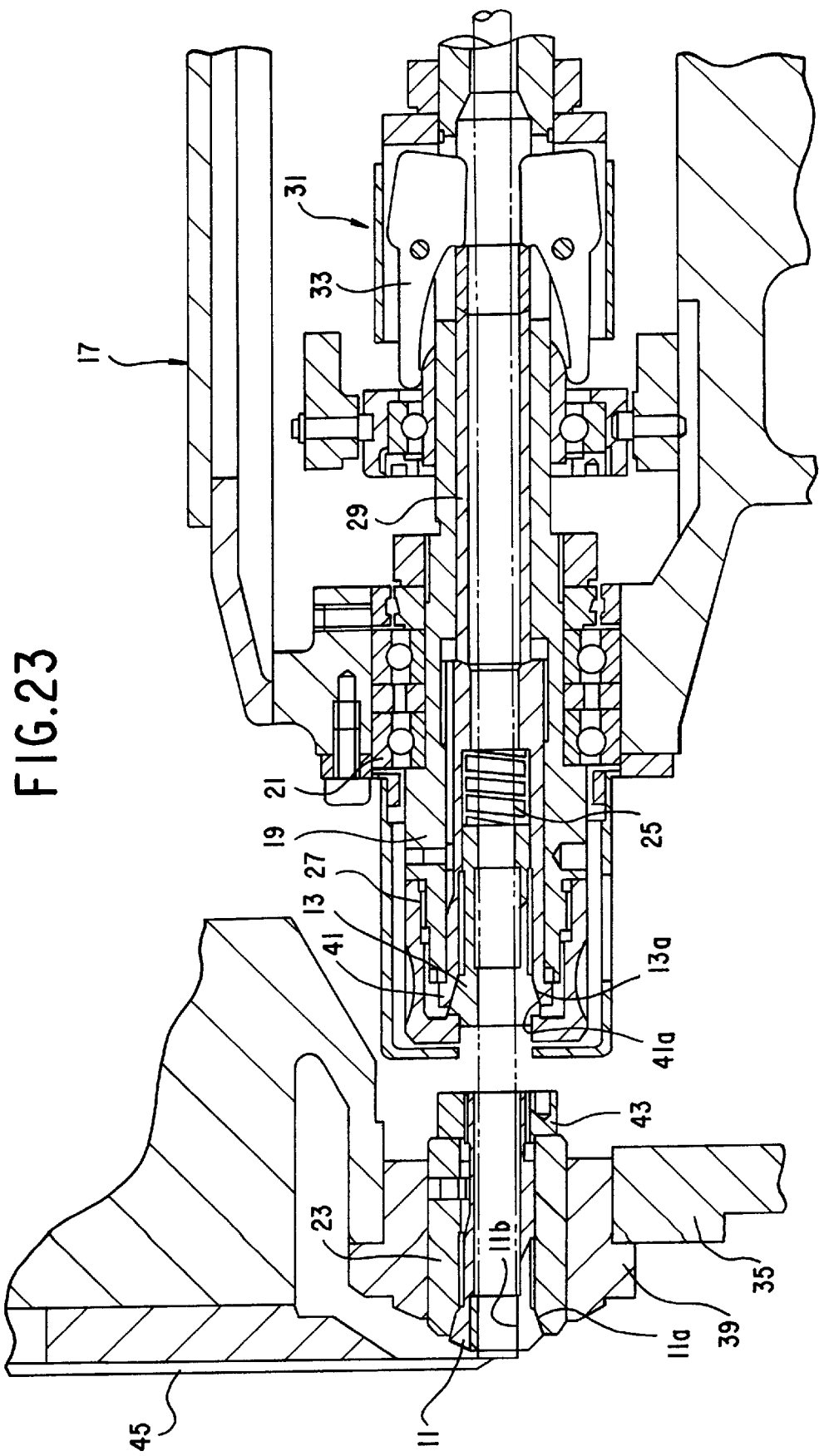
FIG. 23 is a sectional view of only a spindle and associated parts included in an automatic lathe provided with a stationary guide bush unit employing a guide bush to which the present invention is applied.

FIG. 23 is a sectional view showing only a spindle and associated parts of a numerically controlled automatic lathe. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on a bed, not shown, of the numerically controlled automatic lathe for sliding movement in transverse directions, as viewed in FIG. 23.

A spindle 19 is supported for rotation in bearings 21 on the spindle stock 17, and a collet chuck 13 is mounted on the nose of the spindle 19.

The collet chuck 13 having a coned head having a taper outer surface 13a is inserted in the center bore of a chucking sleeve 41 with the taper outer surface 13a in close contact with a taper inner surface 41a formed in a front portion of the chucking sleeve 41.

Further, a coil spring 25 formed by winding a spring band is inserted in an intermediate sleeve 29 at the back end of the collet chuck 13.

The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

That is, when the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 23 to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted, coned head portion of the collet chuck 13 and the taper inner surface 41a of the chucking sleeve 41 moves to the left along the taper outer surface 13a of the collet chuck 13.

Consequently, the collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in FIG. 23 by the stored energy of the coil spring 25.

Consequently, the pressure applied to the taper outer surface 13a of the collet chuck 13 by the taper inner surface 41a of the chucking sleeve 41 is removed to allow the collet chuck 13 to expand by its own resilience, so that the inside diameter of the collet chuck 13 increases to release the workpiece 51.

Further, a column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front portion of the bush sleeve 23.

The guide bush 11 having a front portion provided with a taper outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

When the adjusting nut 43 is turned clockwise, the guide bush 11 moves to the right, as viewed in FIG. 23, relative to the bush sleeve 23 and the taper outer surface 11a of the guide bush 11, similarly to the taper outer surface of the collet chuck 13, is compressed by the taper inner surface 23a of the bush sleeve 23 and the inside diameter of the slitted front portion of the guide bush 11 is reduced.

A cutting tool (cutter) 45 is disposed in further front of the guide bush unit 37.

The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

A rotary guide bush unit that supports rotatably a guide bush 11 gripping a workpiece will be described with reference to FIG. 24, in which parts like or corresponding to those shown in FIG. 23 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in FIG. 24 holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 23, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe is the same in construction as the automatic lathe illustrated in FIG. 23 except that this automatic lathe is provided with the rotary guide bush unit 37, and hence the further description thereof will be omitted.

Guide Bush In Accordance with the Present Invention

A construction of the guide bushes provided with a hard carbon film formed over the inner surface thereof to which the present invention is applied will be described hereinafter.

Figure 1:
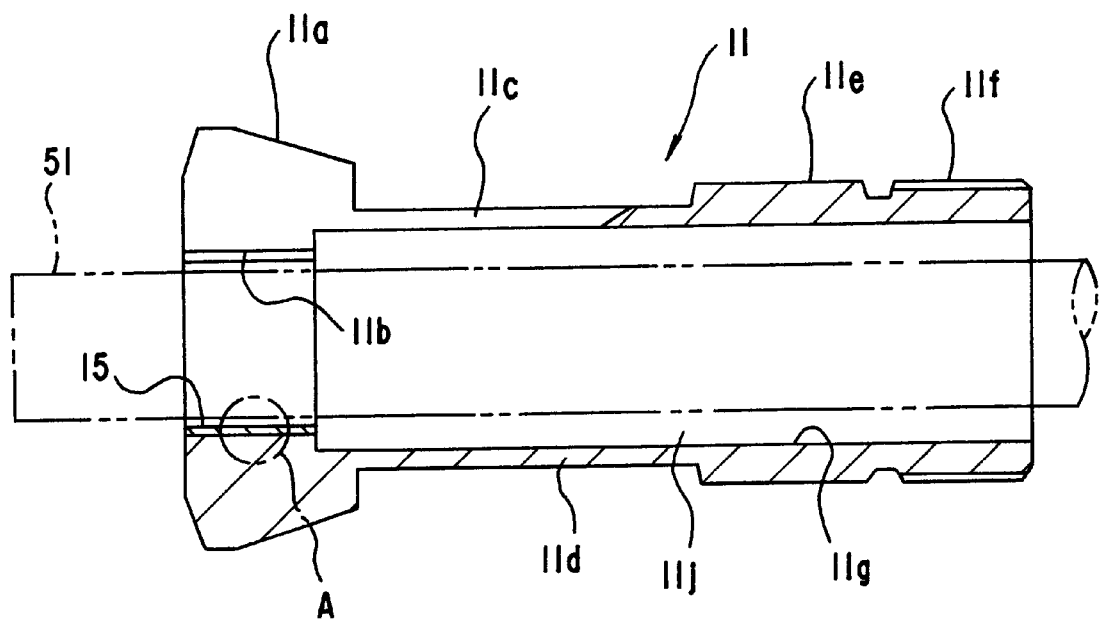
FIG. 1 is a longitudinal sectional view of an example of a guide bush to which the present invention is applied and FIG. 2 is a perspective view of the guide bush of FIG. 1.
Figure 2:
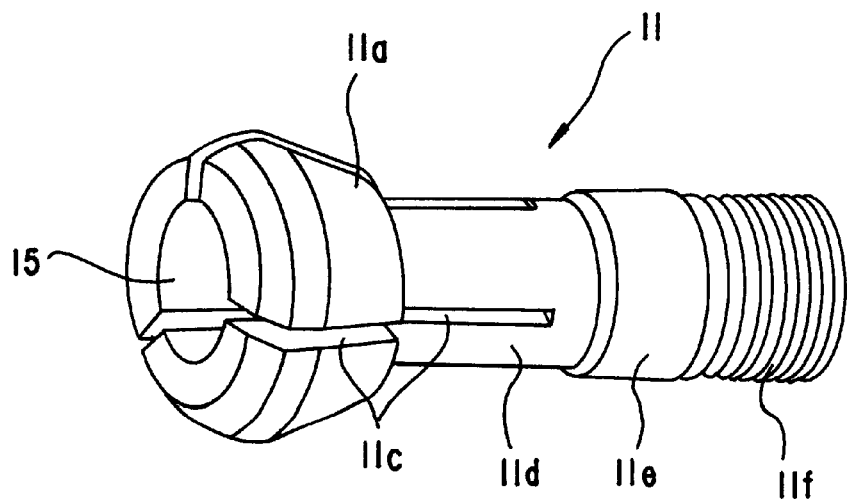

FIGS. 1 and 2 are a longitudinal sectional view and a perspective view, respectively, of the guide bush in a preferred embodiment according to the present invention.

Referring to FIGS. 1 and 2, a guide bush 11 is shown in a free state in which a front end portion is open. The guide bush 11 substantially has a cylindrical shape and also has a center bore in its axial direction with a head portion having a taper outer surface 11a in one longitudinal end thereof and a threaded portion 11f in the other longitudinal end thereof.

Further, the guide bush 11 has a stepped center bore 11g formed along its center axis and having a reduced section in which an inner surface 11b holding a workpiece 51 on the inner side of a head portion having the taper outer surface 11a is formed. An expanded section 11g having a diameter greater than that of the reduced section is formed in a region other than the inner surface 11b.

Three slits 11c are formed at angular intervals of 120° so as to extend through the head portion having the taper outer surface 11a and an elastic bendable portion 11d.

The clearance between the inner surface 11b and the workpiece 51 indicated by imaginary lines in FIG. 1 can be adjusted by pressing the taper outer surface 11a of the guide bush 11 by the taper inner surface of the bush sleeve, so that the elastic bendable portion 11d is bent.

The guide bush 11 has a fitting portion 11e between the elastic bendable portion 11d and the threaded portion 11f. When the guide bush 11 is fitted in the center bore of the bush sleeve 23 shown in FIGS. 23 and 24, the fitting portion 11e fits the center bore closely to set the guide bush 11 with its axis in alignment with the center axis of the spindle.

The guide bush 11 is made of an alloy tool steel (SKS steel). When forming the guide bush 11, a workpiece of alloy tool steel is machined in predetermined external and internal shapes, and the machined workpiece is subjected to quenching and annealing.

Figure 3:
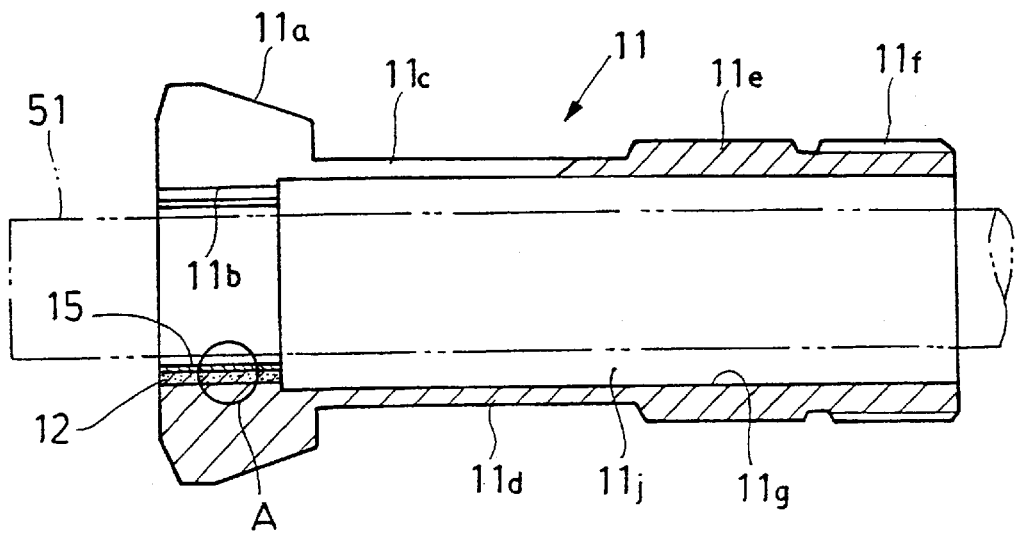
FIG. 3 is a longitudinal sectional view of another example of a guide bush to which the present invention is applied.

Preferably, a superhard lining 12 is attached to the inner surface 11b of the guide bush 11 as shown in FIG. 3 by brazing. The composition of the superhard lining 12 is composed of 85% to 90% of tungsten (W), 5% to 7% of carbon (C), and 3% to 10% of cobalt (Co) as a binder.

When the head portion having the taper outer surface 11a is compressed, a clearance in the range of 5 to 10 $\mu$m is formed between the inner surface 11b and the workpiece 51 in the radial direction thereof to allow the workpiece 51 to slide relative to the guide bush 11, which abrades the inner surface 11b.

When the guide bush 11 is used on a stationary guide bush unit, the workpiece 51 supported on the guide bush 11 rotates at a high surface speed relative to the inner surface 11b and, when an excessively high pressure is applied to the inner surface 11b by the workpiece 51, seizing may occur.

Therefore, the inner surface 11b of the guide bush 11 is coated with a hard carbon film (DLC film) 15 of a thickness in the range of 1 to 5 $\mu$m.

In an example shown in FIG. 1, the hard carbon film 15 is formed on an intermediate layer, which will be described later, formed on the substrate (an alloy tool steel) of the guide bush 11. In an example shown in FIG. 3, the hard carbon film 15 is formed on the superhard lining 12 or on an intermediate layer, which will be described later, formed on the superhard lining 12.

The hard carbon film is very similar in properties to diamond; the hard carbon has a high mechanical strength, a small coefficient of friction, a satisfactory self-lubricity, a satisfactory electrical insulation characteristic, a high thermal conductivity and an excellent corrosion resistance.

The hard carbon film 15 covering the inner surface 11b enhances the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 is reduced, and seizing between the guide bush 11 and the workpiece 51 can be avoided.

Accordingly, the guide bush 11 of the present invention is capable of serving an extended period of use with remarkable improved reliability while properly functioning on the stationary guide bush unit.

Figure 4:
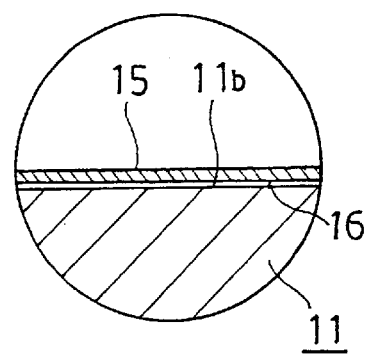
FIGS. 4 to 7 are enlarged sectional views of portions A surrounded by circles in FIGS. 1 and 3.
Figure 5:
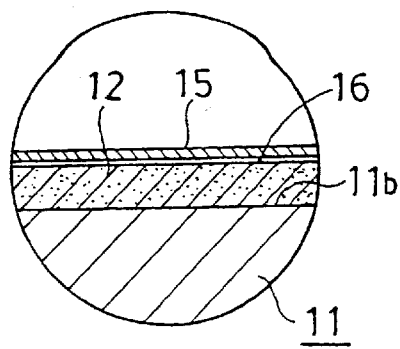
Figure 6:
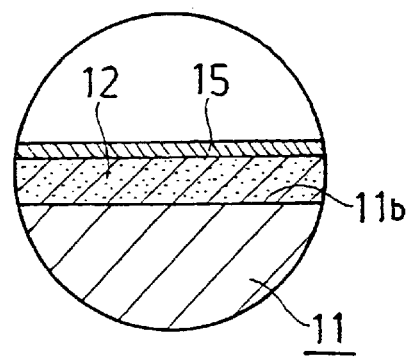
Figure 7:
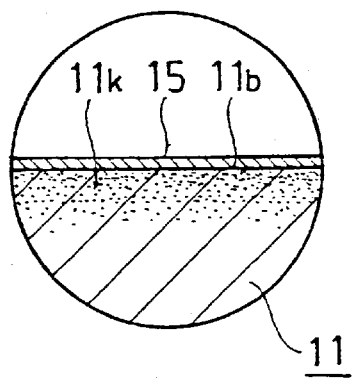
Figure 8:
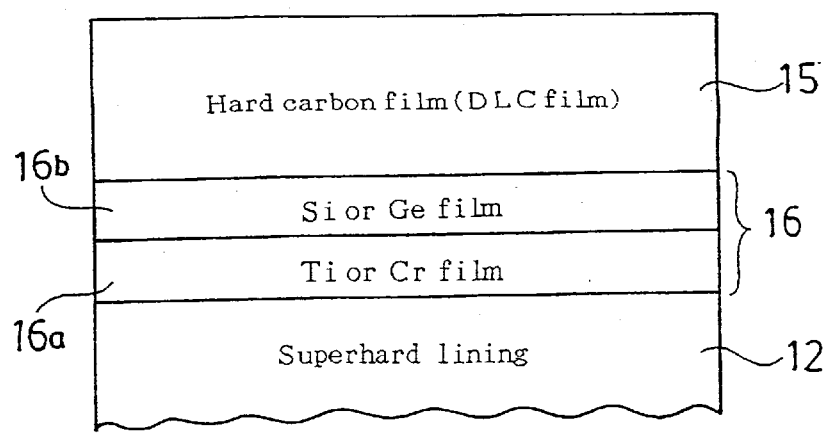
FIG. 8 is a typical enlarged sectional view of a portion of FIG. 5, for explaining the construction of an intermediate layer.

Various structures of layers formed on the inner surface 11b of the guide bush 11 provided with the hard carbon film 15 will be described hereinafter with reference to FIGS. 4 to 7 showing portions A of surrounded circles in FIGS. 1 and 3 in enlarged view, and FIG. 8 showing a portion an intermediate layer shown in FIG. 5 in an enlarged view.

Referring to FIG. 4 showing a portion A in FIG. 1 in an enlarged view, an intermediate layer 16 for enhancing adhesion is formed on the inner surface 11b (alloy tool steel) of the guide bush 11, and a hard carbon film of a thickness in the range of 1 to 5 $\mu$m is formed on the intermediate layer 16. If the substrate of the guide bush 11 permits, the hard carbon film may be formed directly on the inner surface 11b and the intermediate layer 16 may be omitted.

Referring to FIGS. 5 and 6 showing a portion A in FIG. 3 in enlarged views, a superhard lining 12 of a thickness in the range of 2 to 5 mm is attached on the substrate of the inner surface 11b of the guide bush 11 by brazing or the like, and the hard carbon film 15 is formed on the inner surface of the superhard lining 12. This construction further enhances the durability of the guide bush 11.

In the example shown in FIG. 5, an intermediate layer 16 is interposed between the superhard lining 12 and the hard carbon film 15 to further enhance the adhesion.

In these examples, the superhard lining 12 underlying the hard carbon film 15 may be made of a cemented carbide, such as tungsten carbide (WC), or a sintered ceramic material, such as silicon carbide (SiC). Generally, Cr, Ni or Co is added as a binder to a material for producing the sintered ceramic material. The hard carbon film 15 may be formed directly on the superhard lining 12 and the intermediate layer 16 may be omitted when the binder content of the material is small.

An example of the guide bush 11 shown in FIG. 7 has a carburized layer 11k formed by carburizing the inner surface 11b of the substrate of the guide bush 11 at a portion of the substrate in the vicinity thereof instead of the superhard lining 12, and the hard carbon film 15 formed on the carburized inner surface 11b.

Carburization is one generally known surface hardening process that hardens a surface layer of a ferrous alloy maintaining the high toughness of the ferrous alloy. In this example, the guide bush 11 is carburized in an atmosphere of a mixed gas of a carbonaceous gas, for example, such as methane ($CH_4$) or ethylene ($C_2H_4$) and nitrogen gas ($N_2$) as a carrier gas under the following conditions.

| Carburizing Conditions | |
|---|---|
| Temperature | 1100° C. |
| Time | 30 min |
| Depth of carburization | 0.5 mm |

When the guide bush 11 is provided with the carburized layer 11k in the surface of the inner surface 11b of the guide bush 11, the hard carbon film 15 may be formed directly on the inner surface. However, it is preferable to form the hard carbon film 15 on an intermediate layer 16 formed on the inner surface 11b to enhance the adhesion.

The intermediate layer 16 may be formed of an element of group IVb in the periodic table of elements, such as silicon (Si) or germanium (Ge), a compound containing silicon or germanium, or a compound containing carbon, such as a silicon carbide (SiC) or titanium carbide (TiC).

The intermediate layer 16 may be formed of a compound of titanium (Ti), tungsten (W), molybdenum (Mo) or tantalum (Ta) and silicon (Si).

The intermediate layer 16 may be a two-layer film consisting of a lower layer 16a of titanium (Ti) or chromium (Cr), and an upper layer 16b of silicon (Si) or germanium (Ge) as shown in FIG. 8.

The lower layer 16a of titanium or chromium enhances adhesion to the substrate of the guide bush 11, and the upper layer 16b of silicon or germanium and the hard carbon film 15 form covalent bond which bonds the hard carbon film 15 firmly to the intermediate layer 16.

The intermediate layer 16 may be: a two-layer film consisting of a lower layer of a titanium or chromium compound, and an upper layer of a silicon or germanium compound; a two-layer film consisting of a lower layer of titanium or chromium, and an upper layer of a silicon or germanium compound; or a two-layer film consisting of a lower layer of titanium or chromium compound and an upper layer of silicon or germanium.

Intermediate Layer Forming Method

The intermediate layer 16 may be formed by a sputtering process, an ion plating process, a chemical vapor deposition (CVD) process or a metal spraying process.

A method of forming an intermediate layer 16 using a sputtering technique will now be described with reference to FIG. 9.

Figure 9:
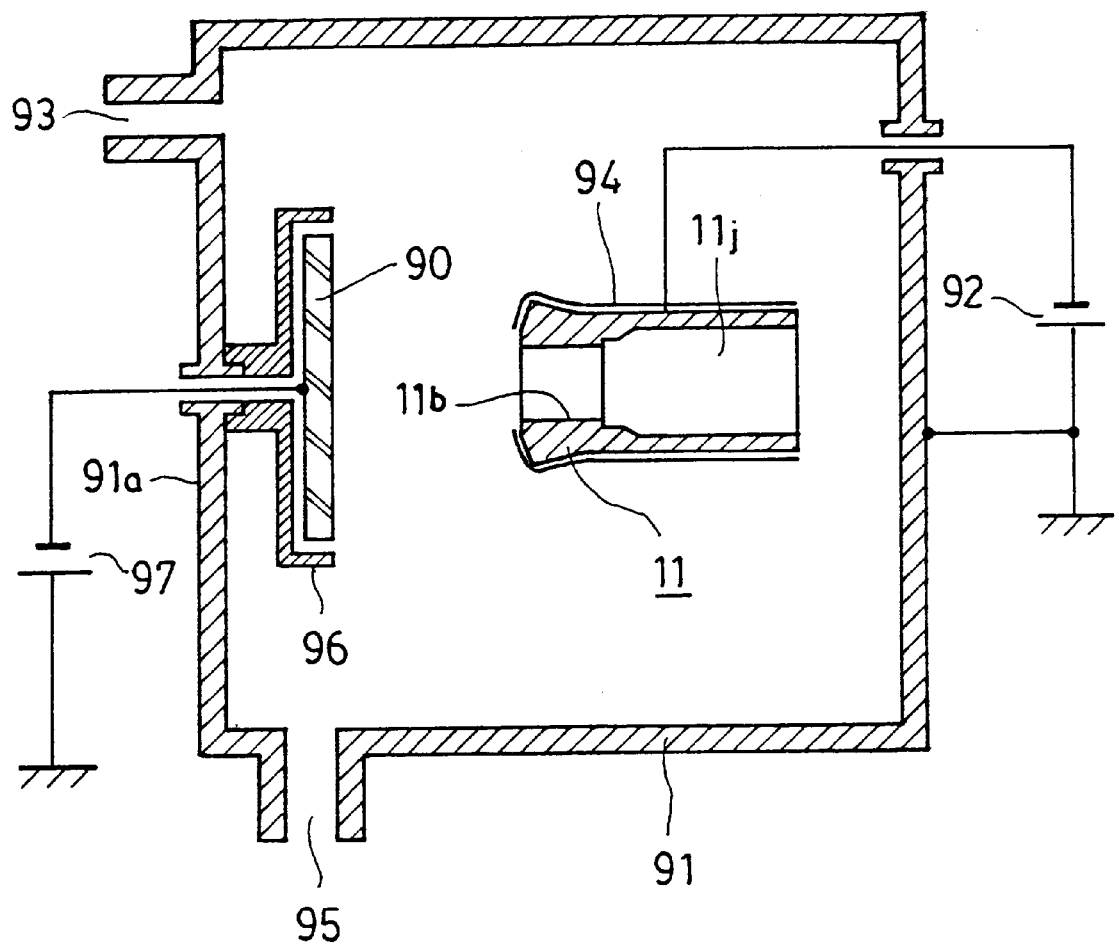
FIG. 9 is a schematic sectional view of an apparatus for explaining an example of a method of forming an intermediate layer over the inner surface of the guide bush.

As shown in FIG. 9, a target cover 96 is fixed to one wall surface 91a of a vacuum vessel 91, and a target 90 which is a material of an intermediate layer 16 is disposed on the target cover 96. The guide bush 11 is disposed to oppose the target 90 while the end thereof having an inner surface 11b is directed towards the target 90. At this time, the guide bush 11 is disposed in a manner such that the actual center line of the center bore 11j is perpendicular to the surface of the target 90.

The target 90 is formed of titanium (Ti), chromium (Cr), silicon (Si), silicon carbide (SiC), or tungsten carbide (WC) which are exemplified as a material of the intermediate layer 16.

The guide bush 11 is connected with a DC power source 92. The target 90 is connected with a target power source 97. The vacuum vessel 91 is evacuated through an evacuation port 95 by an evacuation means, not shown, so that the vacuum vessel becomes less than $3 \times 10^{-5}$ torr in pressure.

Thereafter, argon (Ar) gas as a sputtering gas is introduced into the vacuum vessel 91 through a gas introduction port 93 and the vacuum is adjusted to become $3 \times 10^{-3}$ torr.

Further, thereafter, a negative DC voltage of −50 V is applied to the guide bush 11 from the DC power source 92 and a negative DC voltage of −600 V is applied to the target 90 from the a target power source 97. As a result, a plasma is produced in the vacuum vessel 91 so that the surface of the target 90 is subjected to sputtering by ionized gas in the plasma.

As a result, the material of the intermediate layer which is bombarded from the surface of the target 90 is adhered to the portion which is not covered with a covering member 94 of the guide bush 11 to form the intermediate layer 16 as explained in FIG. 4. Or the intermediate layer 16 may be formed over the superhard lining 12 which is fixed to the inner surface 11b of the guide bush 11 as shown in FIG. 5. The thickness of the intermediate layer 16 is about 0.5 μm.

As shown in FIG. 8, if the intermediate layer 16 is formed of two films comprising a lower layer 16a and an upper layer 16b, first the lower layer 16a of about 0.5 μm is formed using a material (e.g., titanium or chromium) of the lower layer 16a as the target 90, then the upper layer 16b of about 0.5 μm is formed using a material (e.g., silicon or germanium) of the upper layer 16b as the target 90.

When forming the intermediate layer 16, if the outer surface of the guide bush 11 is covered with the covering member 94 such as an aluminum foil, the intermediate layer can be formed over only the inner surface of the guide bush 11 as shown in FIG. 9.

When the superhard lining 12 is made of silicon carbide (SiC), the intermediate layer 16 may be omitted, because silicon carbide is a compound of silicon and carbon included in group IVb of the periodic table of elements and silicon carbide and the hard carbon film 15 formed on the superhard lining 12 make covalent bonds which secure high adhesion.

Hard Carbon Film Forming Method over an Inner Surface of Guide Bush

Various methods of forming the hard carbon film over the inner surface of a guide bush, according to the present invention will be described hereinafter.

A process of preparing a guide bush before the hard carbon film is formed over the inner surface 11b of the guide bush 11 will be described first exemplifying the guide bush shown in FIG. 3.

The guide bush 11 shown in FIG. 3 is formed by machining a workpiece of an alloy tool steel (SKS steel) and has the taper outer surface 11a, the elastic bendable portion 11d, the fitting portion 11e, the threaded portion 11f, the center bore 11j, the inner surface 11b formed in a portion of the center bore 11j, and an expanded section 11g of the center bore 11j, having a diameter greater than that of the inner surface 11b. The cylindrical superhard lining 12 is fixedly bonded to the inner surface 11b of the guide bush 11 by brazing.

The slits 11c are formed at angular intervals of 120° so as to extend through the head portion having the taper outer surface 11a by electric discharge machining.

The inner surface 11b, the taper outer surface 11a and the fitting portion 11e are ground to complete the guide bush 11 in a stage before forming the hard carbon film thereon.

Thereafter, it is preferable to form the intermediate layer having a single layer or double layers with the method set forth in FIG. 9, etc.

Figure 10:
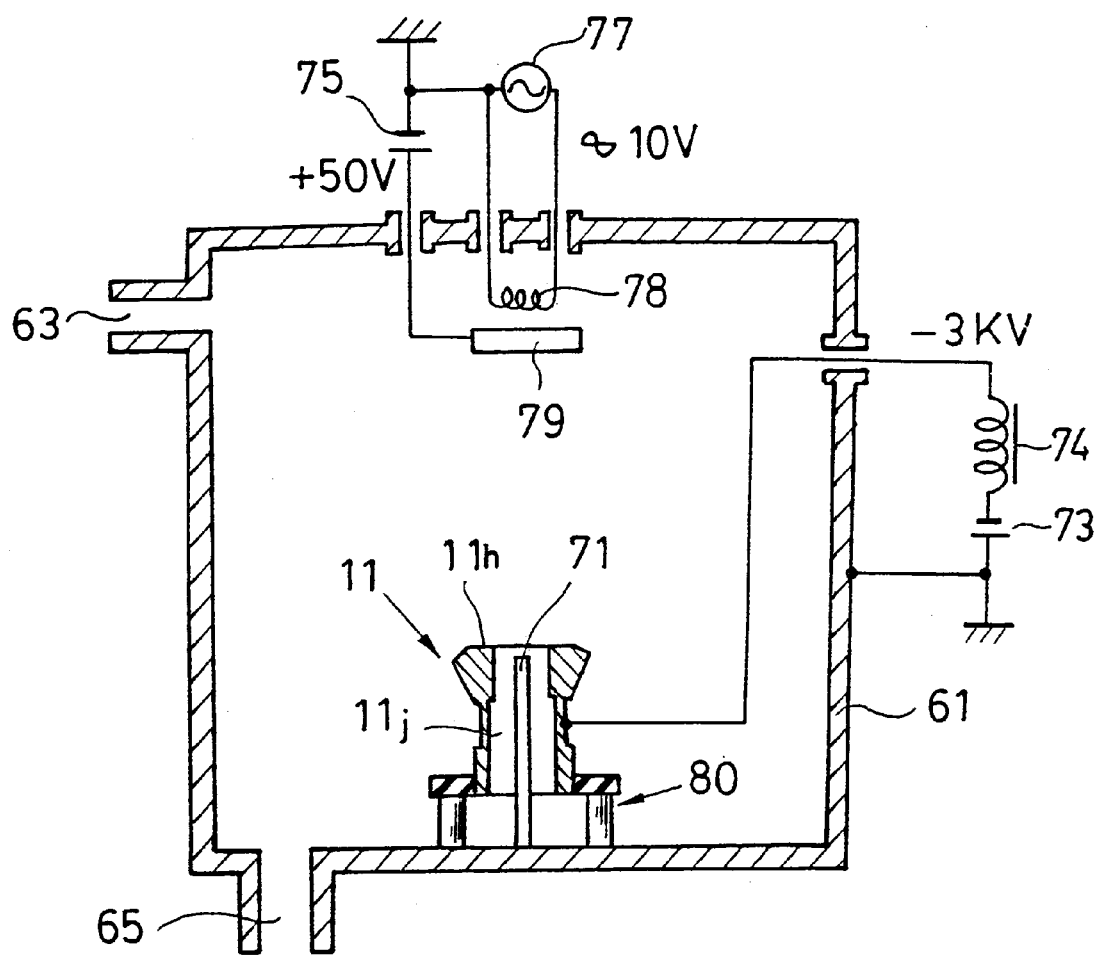
FIG. 10 is a schematic sectional view of an apparatus for explaining a method of forming a hard carbon film over the inner surface of the guide bush according to a first embodiment of the invention.

First Embodiment: FIG. 10

A method of forming a hard carbon film over the inner surface of the guide bush according to the first embodiment of the invention will now be described with reference to FIG. 10.

A vacuum vessel 61 is provided with a gas inlet port 63 and a evacuation port 65 as shown in FIG. 10. An anode 79 and a filament 78 are disposed in the upper central region of the inner space of the vacuum vessel 61. The guide bush 11 is mounted fixedly in an upright position on an insulating support 80 disposed in the lower central region of the inner space of the vacuum vessel 61.

An auxiliary electrode 71 having the shape of a thin rod is disposed in the vacuum vessel 61 so as to extend in the center bore 11j of the guide bush 11 substantially coaxially with the center bore 11j of the guide bush 11 and is connected through the vacuum vessel 61 to be at a ground potential.

The auxiliary electrode 71 is made of a metal, such as a stainless steel. Desirably, the extremity of the auxiliary electrode 71 is about 1 mm inside the guide bush 11 from the end face 11h thereof, i.e., the upper end face as viewed in FIG. 10, of the guide bush 11.

The vacuum vessel 61 is evacuated to a vacuum of $3 \times 10^{-5}$ torr by sucking out gases through the evacuation port 65 from the vacuum vessel 61.

Then, benzene gas, i.e., a gas containing carbon, is supplied through the gas inlet port 63 into the vacuum vessel 61 so that the pressure in the vacuum vessel 61 is maintained at a vacuum of $5 \times 10^{-3}$ torr.

Subsequently, a negative DC voltage is applied to the guide bush 11 by a DC power source 73 through a reactor 74, a positive DC voltage is applied to the anode 79 by an anode power source 75, and an AC voltage is applied to the filament 78 by a filament power source 77, thereby producing a plasma in the vacuum vessel 61 so the hard carbon film of hydrogenated amorphous carbon is formed over the inner surface 11b of the guide bush 11.

Then, a negative DC voltage of about −3 kV is applied to the guide bush 11 by a DC power source 73 and a positive DC voltage of about 50 V is applied to the anode 79 by an anode power source 75. And an AC voltage of about 10 V is applied to the filament 78 by a filament power source 77 so that a current of 30 A flows through the filament 78.

A reactor 74 is formed by winding a copper wire around a core made of a magnetic material and a reactance thereof is set to be about 100 mH.

In such a manner, when the negative DC voltage is applied to the guide bush 11 through the reactor 74 from the DC power source 73, a stabilized plasma can be produced at the peripheral region of the guide bush 11 disposed in the vacuum vessel 61.

Further, the quality and adhesion of the hard carbon film is enhanced because an arc discharge as an abnormal discharge does not occur in the guide bush 11 at the first stage of forming the covering film which influences the quality of the hard carbon film.

Still further, the hard carbon film is able to produce the plasma not only around the outer surface of the guide bush 11 but also inside the center bore 11j because the auxiliary electrode 71 is extended in the center bore 11j of the guide bush 11 while it is grounded.

Therefore, hollow cathode discharge does not occur and the adhesion of a hard carbon film to the inner surface 11b of the guide bush 11 is improved.

Since the distribution of potential with respect to the length of the inner surface of the guide bush 11 is uniform, the hard carbon film 15 can be formed in a uniform thickness over the inner surface 11b. Since the hard carbon film is deposited at a high deposition rate, a hard carbon film having a uniform thickness from the end face 11h through the depth can be formed in a short time.

The auxiliary electrode 71 may be of any diameter provided that the diameter is less than the diameter of the center bore 11j of the guide bush 11. Desirably, the diameter of the auxiliary electrode 71 is determined so that a clearance of about 5 mm, i.e., a clearance for creating a plasma region, is formed between the auxiliary electrode 71 and the inner surface 11b on which the hard carbon film is formed. Desirably, the ratio of the diameter of the auxiliary electrode 71 to the diameter of the bore of the guide bush 11 is not greater than 1/10. When the auxiliary electrode 71 is to be formed in a small diameter, the same may be a wire.

Figure 11:
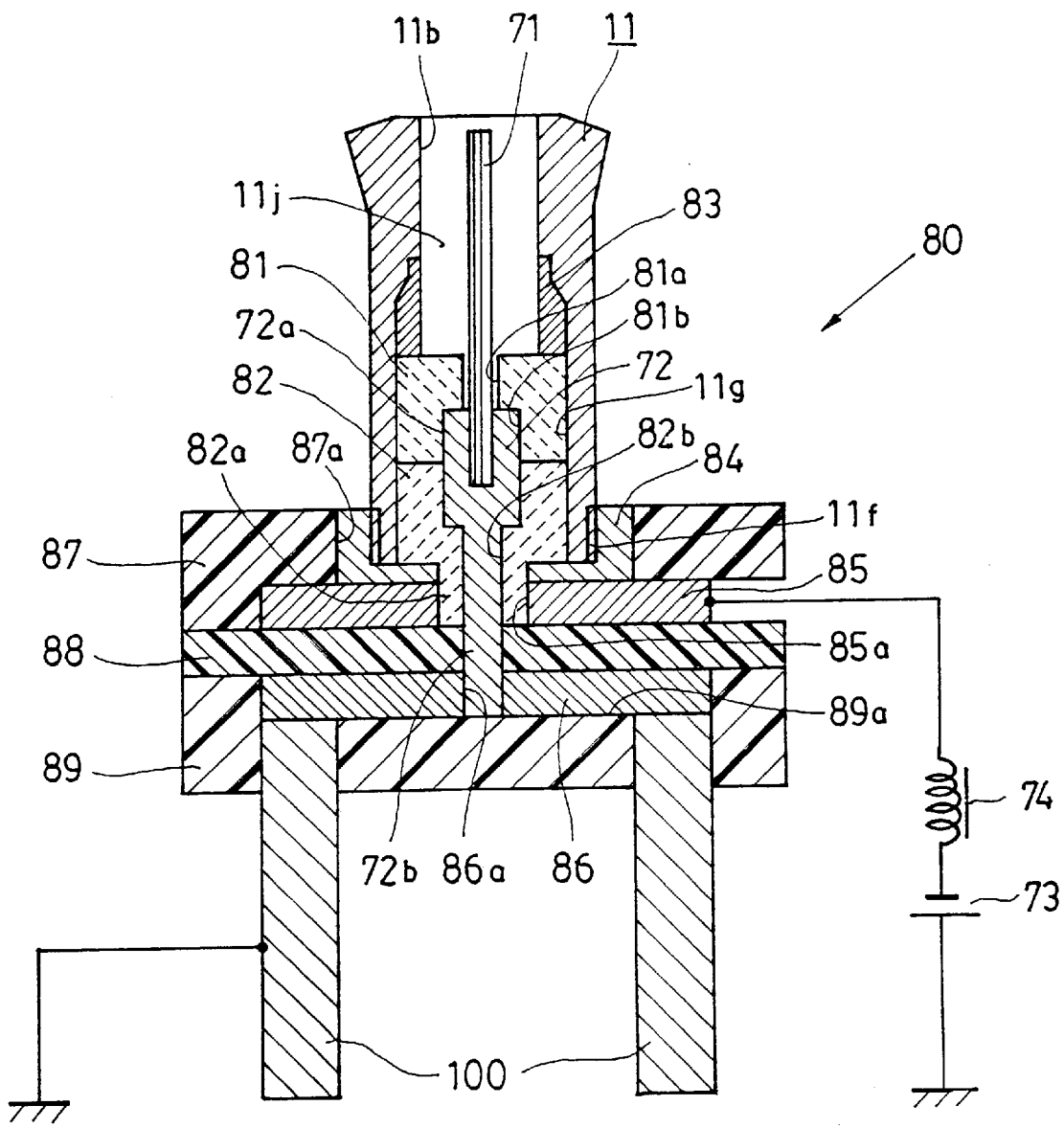
FIG. 11 is a sectional view of an example of a concrete structure of an insulator supporting member 80 as shown in FIG. 10.

Although the auxiliary electrode 71 in this embodiment is formed of a stainless steel, the same may be formed of a metal having a high melting point, such as tungsten (W) or tantalum (Ta). The auxiliary electrode 71 has a circular cross section. A concrete example of a structure of an insulator supporting member: FIG. 11

A concrete example of an insulator supporting member 80 for supporting the guide bush 11 and the auxiliary electrode 71 which are respectively illustrated simply in FIG. 10 will now be described with reference to FIG. 11.

As shown in FIG. 11, the insulator supporting member 80 includes a first electrode plate 85 for electrically connecting with the guide bush 11, and an exposed surface of the insulator supporting member 80 is covered with a first insulating member 87 and a second insulating member 88 respectively made of ceramics or a resin material. The first electrode plate 85 is connected with the DC power source 73 through the reactor 74.

Further, when the hard carbon film is formed over the inner surface 11b of the guide bush 11, a conductive insertion member 83 which functions to eliminate the stage caused by the expanded section 11g near the inner surface 11b is disposed on the inner surface of the center bore 11j of the guide bush 11.

The inner diameter of the insulation member 83 is substantially the same as the diameter of the opening of the inner surface 11b of the guide bush 11. The outer shape of the insulation member 83 is matched with the inner shape of the inner surface 11b of the center bore 11j.

Further, a first insulator 81 for receiving the insulating member 83, and a second insulator 82 for receiving the first insulator 81 are respectively disposed at the expanded section 11g inside the center bore 11j of the guide bush 11. The first insulator 81 and second insulator 82 are respectively formed of insulating material comprising ceramics.

There are defined through holes in the first insulator 81 and second insulator 82, wherein the auxiliary electrode 71 and auxiliary electrode supporting member 72 through which the auxiliary electrode 71 is engaged and supported are inserted therein, and the second insulator 82 has a protruding part 82a to protrude from the guide bush 11. The auxiliary electrode 71 is supported by the auxiliary electrode supporting member 72 to be disposed at the center inside the center bore 11j of the guide bush 11.

There are defined in the first insulator 81 a small diameter hole part 81a through which the auxiliary electrode 71 passes with a gap of about 0.01 mm to 0.05 mm and a large diameter hole part 81b for positioning a large diameter part 72a of the auxiliary electrode supporting member 72. That is, the first insulator 81 has a stepped hole part.

On the other hand, the second insulator 82 has a stepped hole part 82b for positioning the large diameter part 72a and a small diameter part 72b of the auxiliary electrode supporting member 72. The protruding part 82a of the second insulator 82 is engaged in a hole part 85a of the first electrode plate 85.

Further, a guide bush receiver 84 having a female screw is screwed onto a male screw of the threaded portion 11f of the guide bush 11. The guide bush receiver 84 serves to prevent the first insulator 81 and second insulator 82 from coming off from the center bore 11j of the guide bush 11, and it is formed of a metal such as a stainless steel. The first insulating member 87 has an opening part 87a matching with the outer dimensions of the guide bush receiver 84.

Since the bottom surface of the guide bush receiver 84 contacts the upper surface of the first electrode plate 85, the area where the guide bush 11 and the first electrode plate 85 contact each other is made large. Accordingly, the negative DC voltage can be stably applied from the DC power source 73 through the reactor 74, thereby preventing any dispersion of the thickness of the hard carbon film and of the quality thereof.

Meanwhile, a recess 89a is defined in a third insulating member 89 on which the second insulating member 88 is placed, and a second electrode plate 86 is engaged in the recess 89a to be flush therewith. The small diameter part 72b of the auxiliary electrode supporting member 72 protrudes downward from the second insulator 82 to penetrate the second insulating member 88 and is engaged in a center hole 86a of the second electrode plate 86.

A plurality of metal legs 100 which are engaged in a third insulating member 89 are provided perpendicularly relative to the second electrode plate 86 so as to be brought into contact with the back surface of the second electrode plate 86, and they are placed on the bottom surface of the vacuum vessel 61 formed of a conductive material as shown in FIG. 10.

Accordingly, the auxiliary electrode 71 is grounded through the auxiliary electrode supporting member 72, second electrode plate 86, legs 100 and vacuum vessel 61.

In such a manner, when the auxiliary electrode 71 and auxiliary electrode supporting member 72 are disposed on the expanded section 11g of the guide bush 11 through the first insulator 81 and second insulator 82, the auxiliary electrode 71 can be correctly disposed at the center of the center bore 11j of the guide bush 11.

If the auxiliary electrode 71 is disposed so as to be displaced from the center of the center bore 11j, the balance of the plasma discharge between the auxiliary electrode 71 and the inner surface 11b of the guide bush 11 is lost, thereby generating the dispersion of the thickness and the poor quality of the hard carbon film.

Accordingly, the first insulator 81 and second insulator 82 are inserted into the expanded section 11g so that they are matched with the inner diameter of the expanded section 11g of the guide bush 11, and then the auxiliary electrode 71 is restricted in position by the small diameter hole part 81a, the large diameter hole part 81b and stepped hole part 82b of the first and second insulators 81 and 82 so that the auxiliary electrode 71 can be correctly disposed at the center of the center bore 11j of the guide bush 11. Accordingly, the dispersion of the thickness and the poor quality of the hard carbon film formed over the inner surface 11b does not occur.

Further, since the protruding part 82a of the second insulator 82 protruding from the guide bush 11 is engaged in the hole part 85a of the first electrode plate 85 as set forth above, the guide bush 11 and the auxiliary electrode 71 can be completely insulated and separated from each other by the protruding part 82a.

Figure 12:
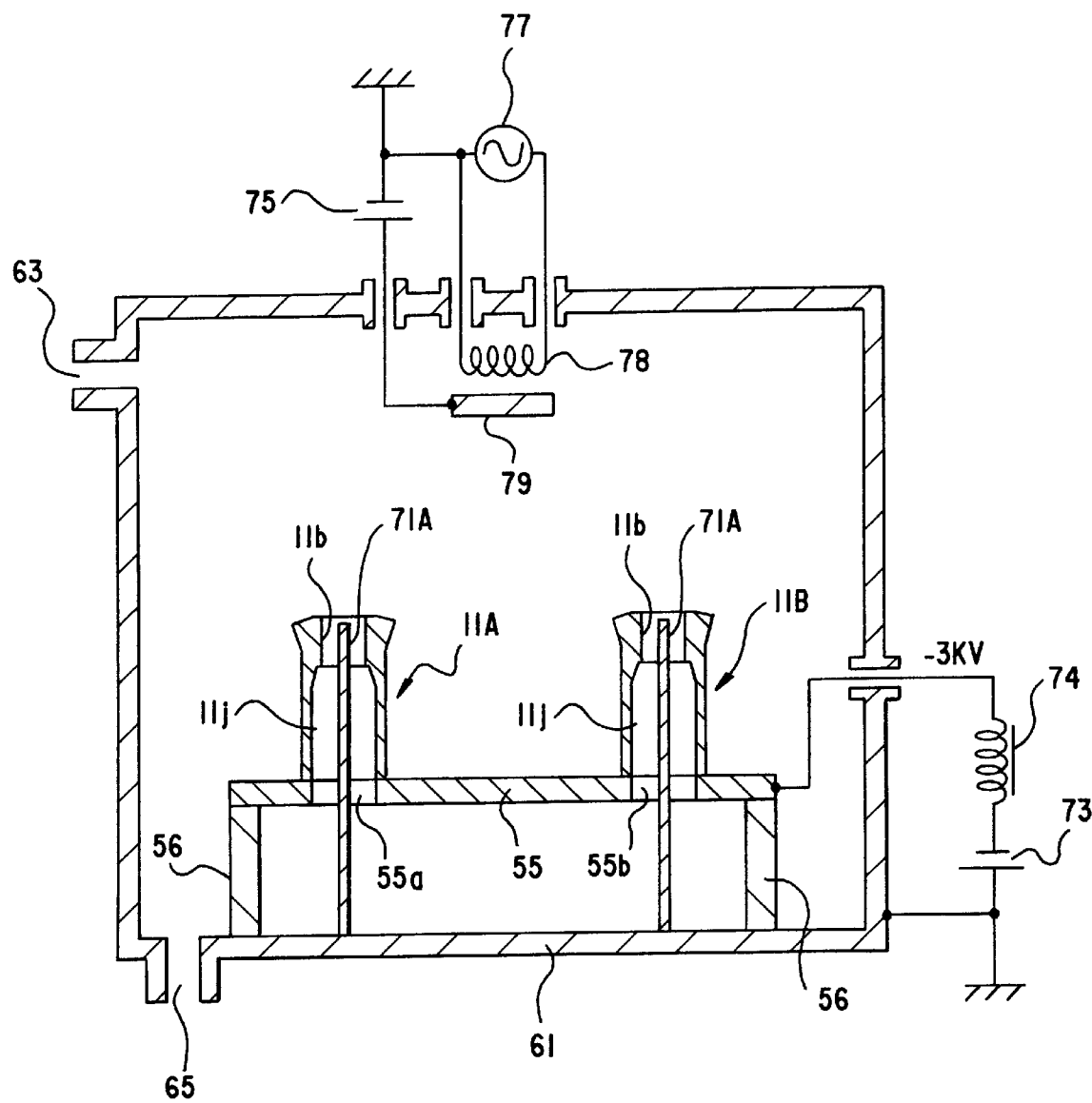
FIGS. 12 to 18 are respectively schematic sectional views of an apparatus for explaining a method of forming a hard carbon film over the inner surface of a guide bush according to second to eighth embodiments of the invention.

Second Embodiment: FIG. 12

A method of forming a hard carbon film over the inner surface of the guide bush according to the second embodiment of the invention will now be described with reference to FIG. 12.

The second embodiment and third and fourth embodiments which are explained subsequently are embodiments wherein a plurality of guide bushes are disposed in the vacuum vessel as shown in FIG. 10, and the hard carbon films are formed at the same time over respective inner surfaces of these guide bushes.

In the second embodiment shown in FIG. 12, two guide bushes 11A and 11B are disposed in the vacuum vessel 61, and auxiliary electrodes 71A and 71B are inserted into each center bore 11j of the guide bushes 11A and 11B. Two guide bushes 11A and 11B are respectively placed on a conductive plate 55 having openings 55a and 55b through which the auxiliary electrodes 71A and 71B are inserted so that the auxiliary electrodes 71A and 71B are positioned at the centers of each center bore 11j.

The auxiliary electrodes 71A and 71B are respectively fixed perpendicularly to the bottom surface of the vacuum vessel 61 formed of a conductive material and are grounded through the vacuum vessel 61.

The conductive plate 55 is insulated from and placed on the bottom of the vacuum vessel 61 by the legs 56 respectively formed of an insulating material.

A negative DC voltage is applied to the conductive plate 55 from the DC power source 73 through the reactor 74 whereby it is applied to the guide bushes 11A and 11B. That is, in the second embodiment, the DC voltage is applied to two guide bushes 11A and 11B through a single reactor.

Further, other conditions are the same as those set forth in the first embodiment in FIG. 10 wherein a plasma is produced in the vacuum vessel 61 and the hard carbon films are formed at the same time over the inner surfaces 11b of the guide bushes 11A and 11B by a plasma CVD method.

Figure 13:
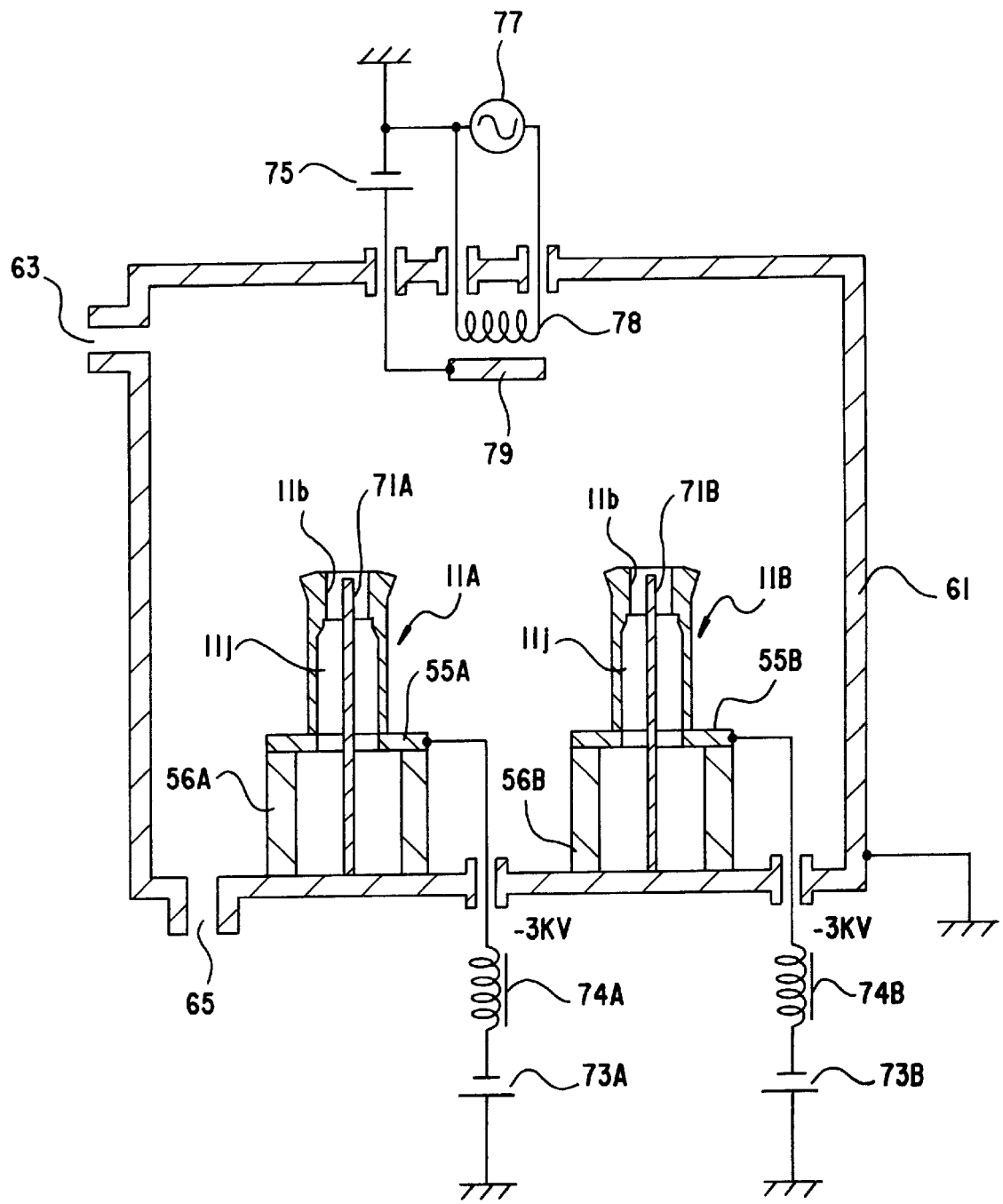

Third Embodiment: FIG. 13

A method of forming a hard carbon film over the inner surface of the guide bush according to the third embodiment of the invention will now be described with reference to FIG. 13.

In the third embodiment, the point which is different from the second embodiment is that, as shown in FIG. 13, two guide bushes 11A and 11B are respectively placed on individual conductive plates 55A and 55B which are respectively disposed on the bottom surface of the vacuum vessel 61 through legs 56A and 56B, and a negative DC voltage is individually applied to the guide bushes 11A and 11B from the individual DC power sources 73A and 73B through individual reactors 74A and 74B and conductive plates 55A and 55B. The reactance value of the reactors 74A and 74B are respectively set to about 100 mH.

According to the third embodiment, the independence of the plasma charge can be enhanced between the plurality of guide bushes 11A and 11B. Accordingly, there does not occur any interference between the plasma discharges so that the plasma discharge is stabilized, thereby forming a hard carbon film which is excellent in the quality and adhesion over the inner surfaces 11b of the guide bushes 11A and 11B.

Figure 14:
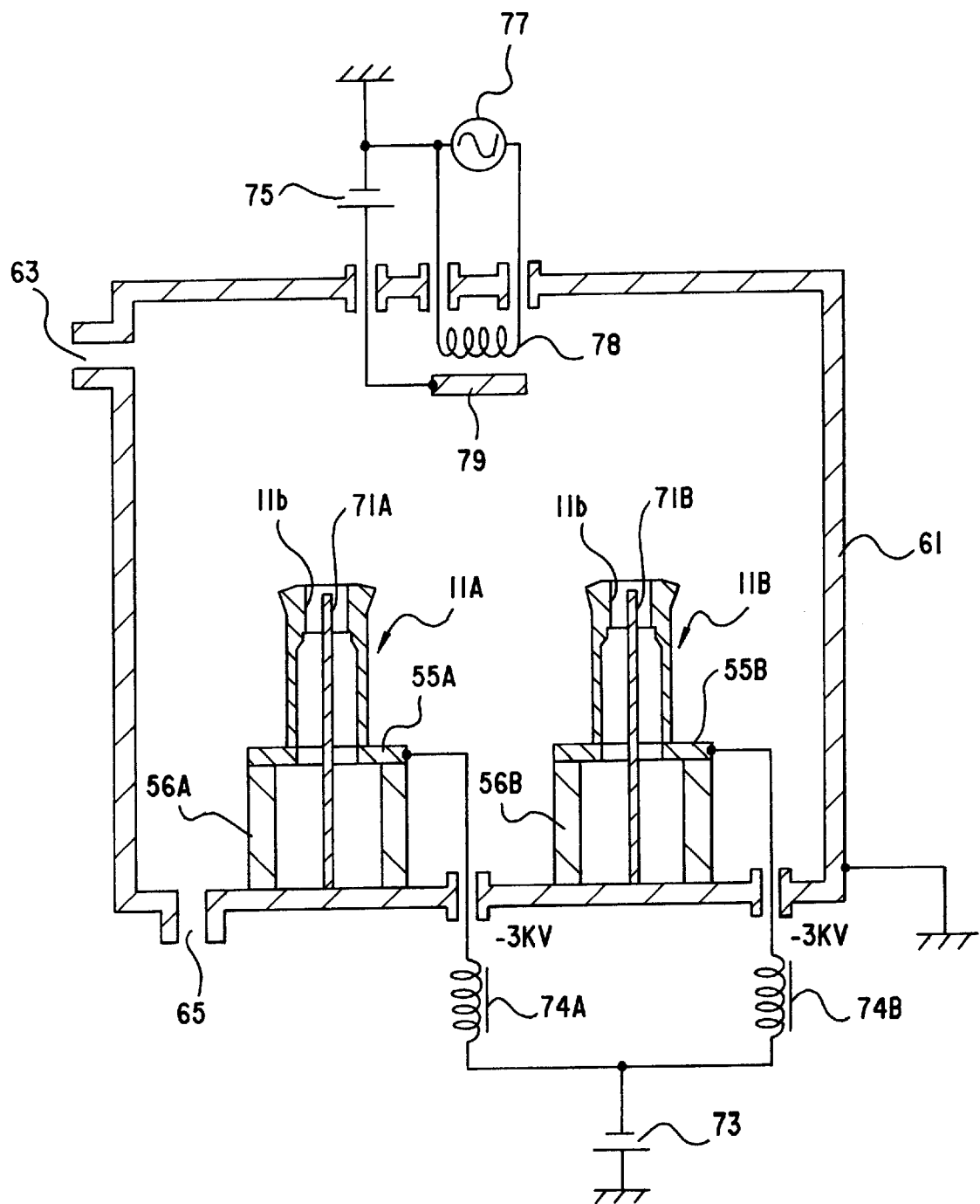

Fourth Embodiment: FIG. 14

A method of forming a hard carbon film over the inner surface of the guide bush according to the fourth embodiment of the invention will now be described with reference to FIG. 14.

In the fourth embodiment, the point which is different from the third embodiment is that, as shown in FIG. 14, a negative DC voltage is applied to two guide bushes 11A and 11B from a common power source 73 through the individual reactors 74A and 74B and conductive plates 55A and 55B.

According to the fourth embodiment, the manufacturing cost of the apparatus can be reduced by making the power source 73 common to the guide bushes 11A and 11B while enhancing the independence of the plasma charges between a plurality of guide bushes 11A and 11B.

Figure 15:
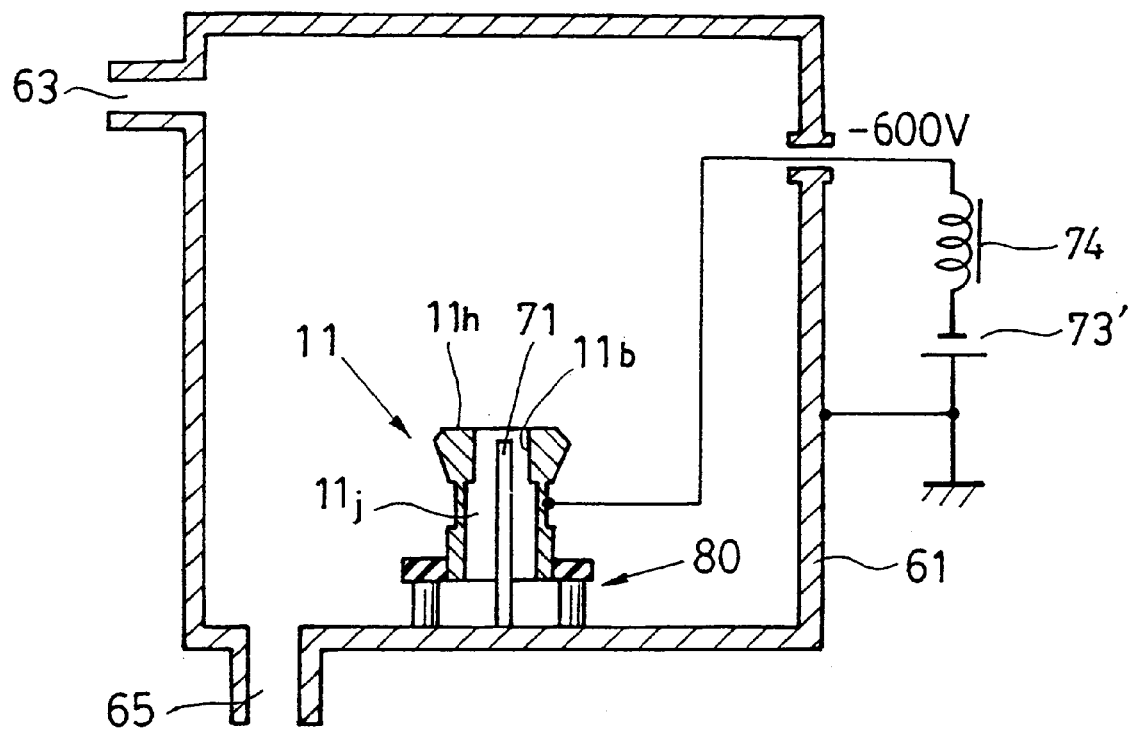

Fifth Embodiment: FIG. 15

A method of forming a hard carbon film over the inner surface of the guide bush according to the fifth embodiment of the invention will be now described with reference to FIG. 15.

In FIG. 15, components corresponding to those in FIG. 10 are denoted by the same numerals, and the explanation thereof is omitted.

The anode 79 and filament 78 as shown in FIG. 10 are not provided in the vacuum vessel 61 used in the fifth embodiment.

The hard carbon film forming method using this apparatus differs from that using the apparatus in the first embodiment shown in FIG. 10 in that only a DC voltage of −600 V is applied to a guide bush 11 disposed in the vacuum vessel 61 with a grounded auxiliary electrode 71 from a DC power source 73' through the reactor 74 and methane gas ($CH_4$) as a gas containing carbon is supplied into the vacuum vessel 61 so that the pressure in the vacuum vessel 61 is maintained at a vacuum of 0.1 torr.

A stable plasma is produced around both the outer and the inner surface and a hard carbon film which is excellent in the quality and adhesion is formed over the entire surface of the guide bush 11. The hard carbon film 15 can be formed in a substantially uniform thickness over the entire length of the inner surface 11b facing the auxiliary electrode 71 in a short time.

Figure 16:
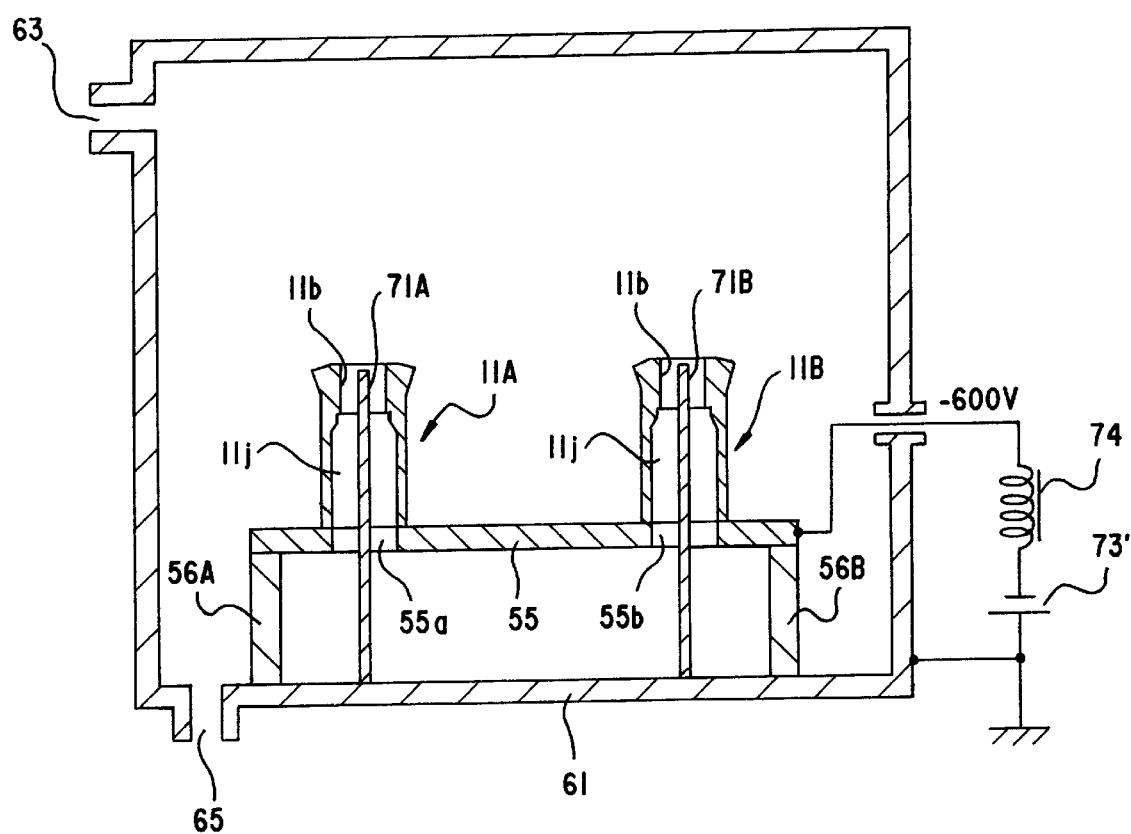

Sixth Embodiment: FIG. 16

A method of forming a hard carbon film over the inner surface of the guide bush according to the sixth embodiment of the invention will now be described with reference to FIG. 16.

The sixth embodiment and seventh and eighth embodiments which are explained subsequently are embodiments wherein a plurality of guide bushes are disposed in the vacuum vessel, and the hard carbon films are formed at the same time over the inner surfaces of the guide bushes similarly to the second through fourth embodiments shown in FIGS. 12 through 14.

In FIG. 16, components which are the same as those in FIG. 12 are denoted by the same numerals, and the explanation thereof is omitted.

In the sixth embodiment shown in FIG. 16, the point which is different from the second embodiment shown in FIG. 12 is that the vacuum vessel 61 not provided with the anode 79 and the filament 78 is used similarly to the fifth embodiment shown in FIG. 15 and a plasma is produced in the vacuum vessel 61 merely by applying a DC voltage of −600 V to two guide bushes 11A and 11B disposed inside the vacuum vessel 61 from a DC power source 73' through the single reactor 74.

The sixth embodiment achieves the same effect as the second embodiment.

Figure 17:
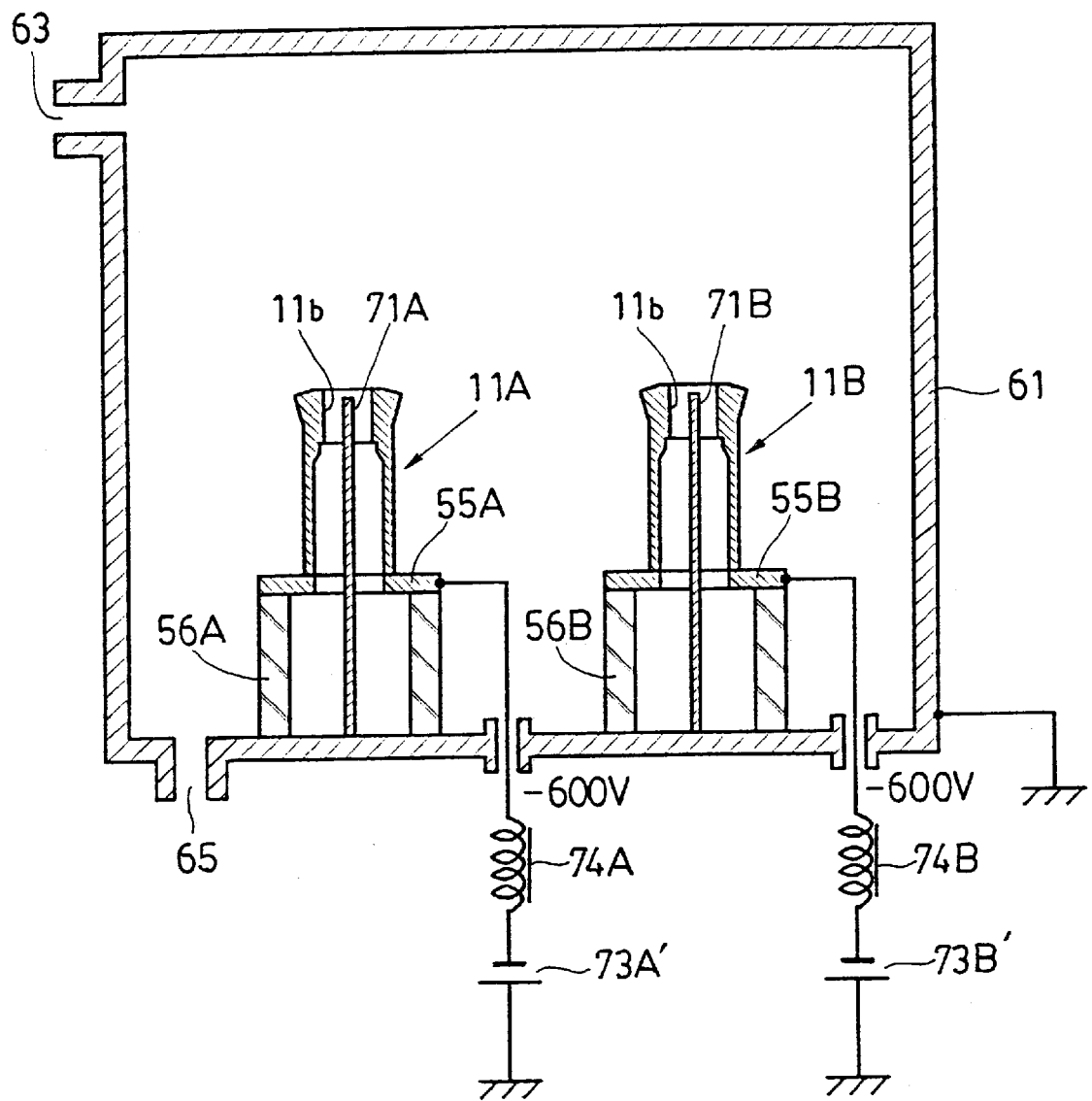

Seventh Embodiment: FIG. 17

A method of forming a hard carbon film over the inner surface of the guide bush according to the seventh embodiment of the invention will now be described with reference to FIG. 17.

In FIG. 17, components which are the same as those shown in FIG. 13 are denoted by the same numerals, and the explanation thereof is omitted.

In the seventh embodiment in FIG. 17, the point which is different from the third embodiment in FIG. 13 is that the vacuum vessel 61 not provided with the anode 79 and the filament 78 is used similarly to the fifth embodiment shown in FIG. 15 and a plasma is produced in the vacuum vessel 61 merely by applying a DC voltage of −600 V to two guide bushes 11A and 11B disposed inside the vacuum vessel 61 from individual DC power sources 73A' and 73B' through individual reactors 74A and 74B.

The seventh embodiment achieves the same effect as the third embodiment.

Figure 18:
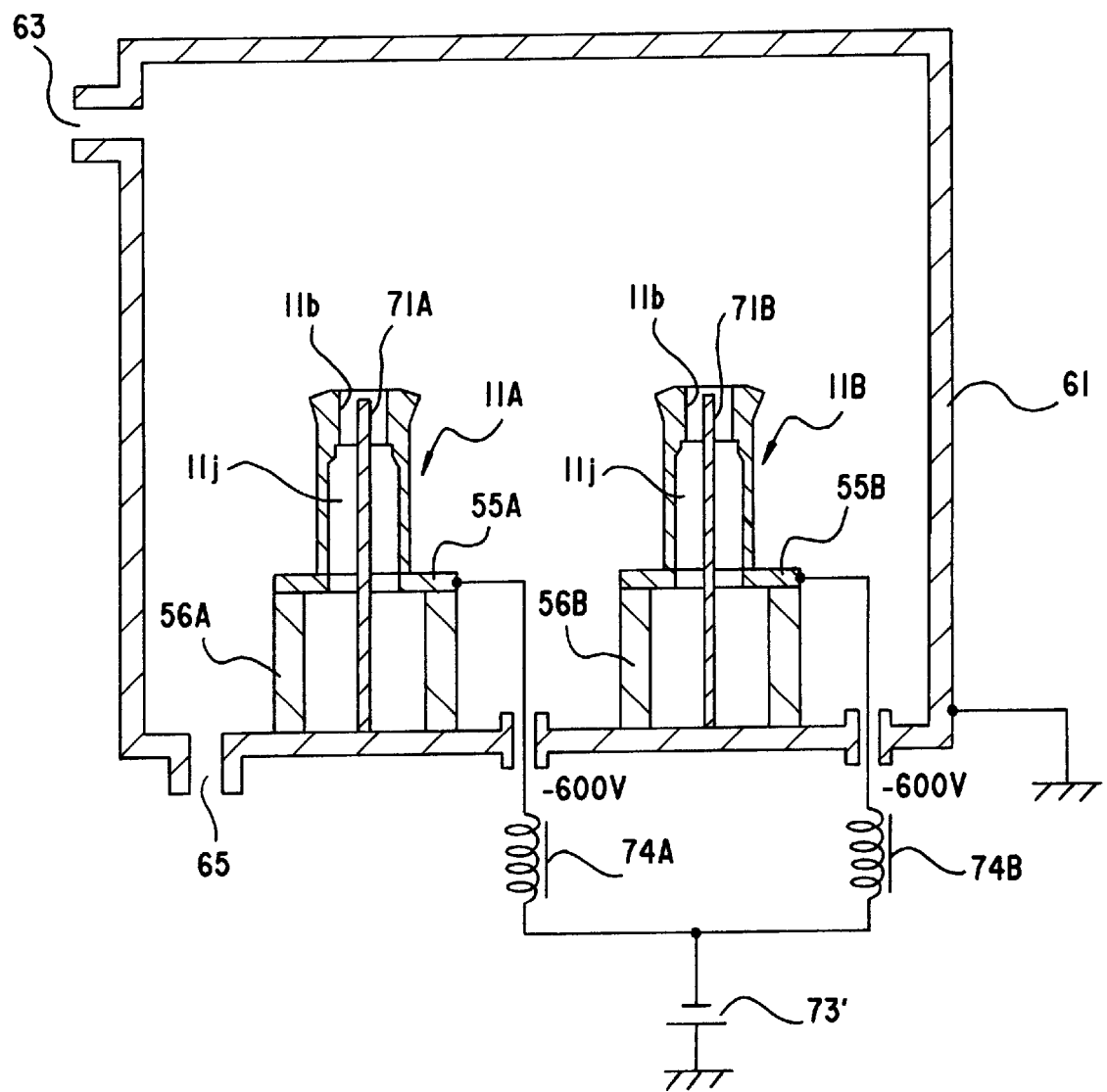

Eighth Embodiment: FIG. 18

A method of forming a hard carbon film over the inner surface of the guide bush according to the eighth embodiment of the invention will now be described with reference to FIG. 18.

In FIG. 18, components which are the same as those shown in FIG. 14 are denoted by the same numerals, and the explanation thereof is omitted.

In the eighth embodiment in FIG. 18, the point which is different from the fourth embodiment in FIG. 14 is that the vacuum vessel 61 not provided with the anode 79 and the filament 78 is used similarly to the fifth embodiment shown in FIG. 15 and a plasma is produced in the vacuum vessel 61 merely by applying a DC voltage of −600 V to two guide bushes 11A and 11B disposed inside the vacuum vessel 61 from the common DC power source 73' through individual reactors 74A and 74B.

The eighth embodiment achieves the same effect as the fourth embodiment.

Figure 19:
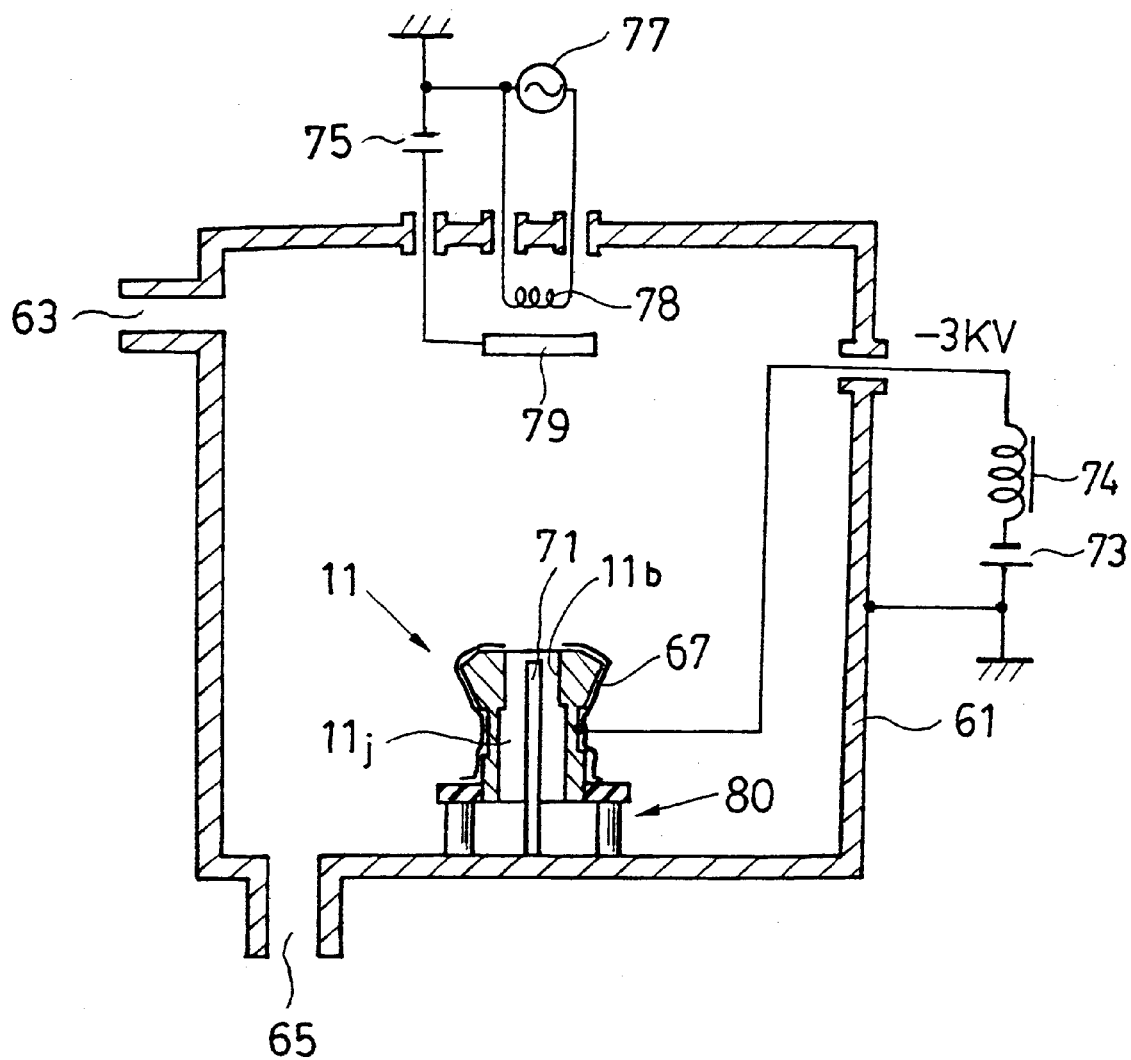
FIG. 19 is a sectional view like FIG. 10 in which a covering member is added to the first embodiment in FIG. 10.

Ninth Embodiment: FIG. 19

In the above explanations, the hard carbon film is formed over both outer and inner surfaces of the guide bush 11, but it can be formed over the inner surface alone.

The embodiment in this case is explained with reference to FIG. 19. In FIG. 19, the point which is different from FIG. 10 is that the outer surface of the guide bush 11 is covered with a cover member 67 such as an aluminum foil.

In such a manner, a strong hard carbon film can be formed over only the surface inside the center bore 11j including the inner surface 11b of the guide bush 11.

With such an arrangement, the outer dimensions of the guide bush can be maintained with high accuracy, and it is possible to prevent the portion where the slits are formed, by the provision of the hard carbon film over the entire surface of the guide bush, from being deteriorated in toughness.

Figure 20:
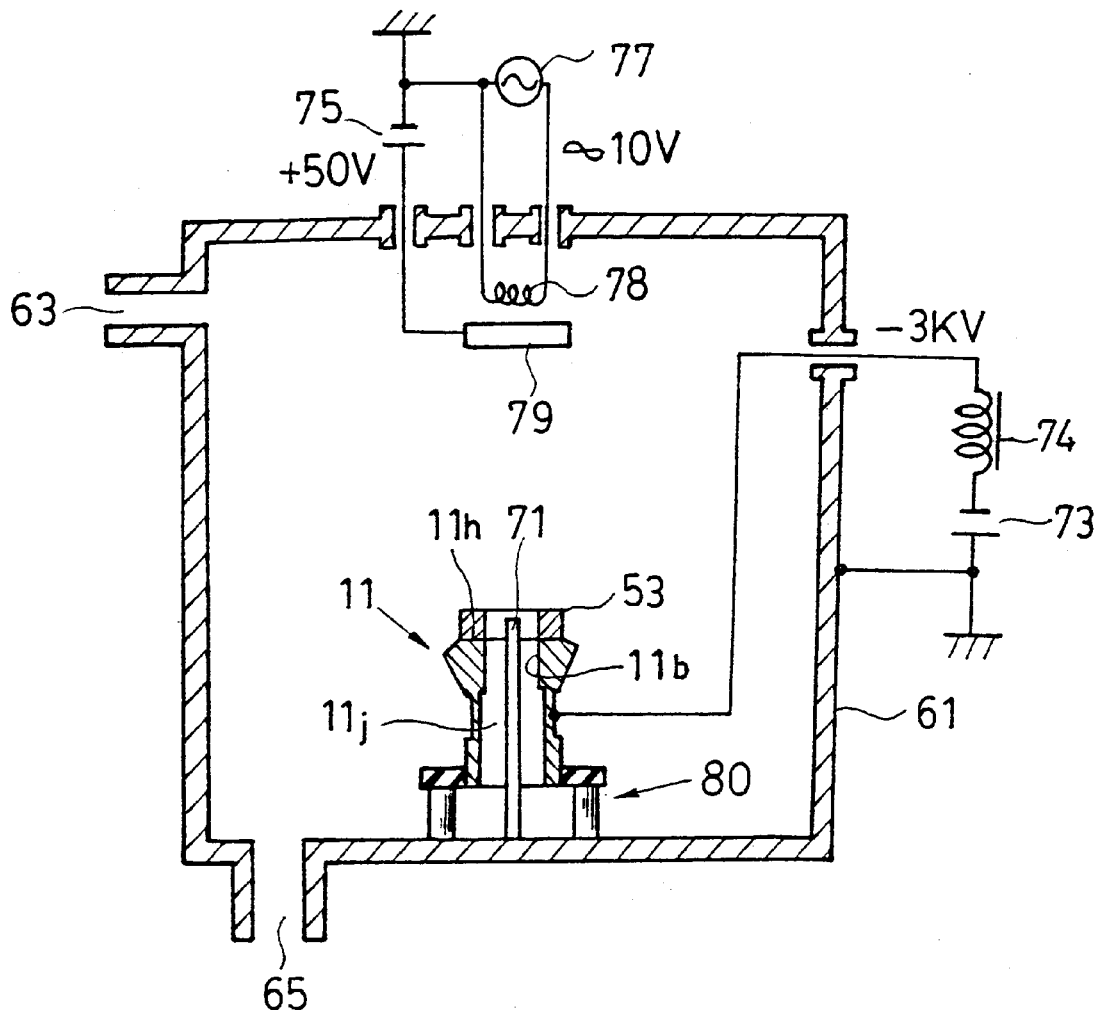
FIG. 20 is a schematic sectional view of an apparatus like FIG. 10 for explaining an embodiment of a method of forming a hard carbon film over the inner surface of the guide bush using a dummy member.
Figure 21:
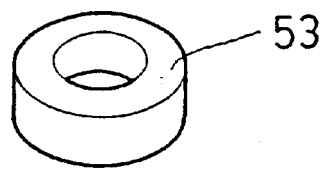
FIG. 21 is a perspective view of the dummy member employed by the embodiment in FIG. 20.

Tenth Embodiment: FIGS. 20 and 21

A method of forming a hard carbon film over the inner surface of the guide bush according to the tenth embodiment of the invention will now be described with reference to FIGS. 20 and 21.

In FIG. 20, components which are the same as those shown in FIG. 10 are denoted by the same numerals, and the explanation thereof is omitted.

In FIG. 20, the point which is different from FIG. 10 is that a ringlike dummy member 53 having substantially the same inner diameter as the diameter of the inner surface 11b of the guide bush 11 as shown in FIG. 21 is used. The dummy member 53, similarly to the auxiliary electrode 71, is formed of a stainless steel and has an outside diameter substantially equal to the outside diameter of the end face 11h of the guide bush 11 in which the bore of the guide bush 11 opens.

As shown in FIG. 20, the guide bush 11 on which a hard carbon film is to be formed is disposed in the vacuum vessel 61 having the gas inlet port 63 and the evacuation port 65, and the dummy member 53 is put on the end face 11h of the guide bush 11 so that the inner surface 11b of the guide bush 11 and that of the dummy member 53 are aligned.

As mentioned above, the super hard lining is fixed to, or the intermediate layer may be formed over the inner surface 11b of the guide bush 11 beforehand.

The guide bush 11 is disposed in the vacuum vessel 61 with the auxiliary electrode at a ground potential, extended in the center bore 11j of the guide bush 11 similarly to the first embodiment shown in FIG. 10. Preferably, the extremity of the auxiliary electrode 71 does not project from and is slightly below the upper end face of the dummy member 53.

The hard carbon forming method is the same in other respects as that previously described with reference to FIG. 10. To make sure of it, the gases prevailing in the vacuum vessel 61 are sucked out through the evacuation port 65 to evacuate the vacuum vessel 61 to a vacuum of $3 \times 10^{-5}$ torr. After thus evacuating the vacuum vessel 61, benzene gas ($C_6H_6$) as a gas containing carbon is supplied through the gas inlet port 63 into the vacuum chamber 61 so that the pressure in the vacuum vessel 61 is maintained at a vacuum of $5 \times 10^{-3}$ torr.

A DC voltage of −3 kV is applied to the guide bush 11 by the DC power source 73 through the reactor 74, a DC voltage of +50 V is applied to the anode 79 by the anode power source 75, and an AC voltage of 10 V is applied to the filament 78 by the filament power source 77 so that a current of 30 A flows through the filament 78.

Consequently, a plasma is produced in a region surrounding the guide bush 11 in the vacuum vessel 61 and a hard carbon film is formed over the surface of the guide bush 11 including the inner surface 11b by a plasma CVD method.

The auxiliary electrode 71 functions same as the above first embodiment, and the dummy member 53 functions as follows.

In this method of forming a hard carbon film over the guide bush 11, the plasma is produced around the inner and the outer surface of the guide bush 11. Electric charges are liable to be concentrated on the end face of the guide bush 11 and the potential of a portion of the guide bush around the end face tends to become higher than that of the inner surface due to an edge effect. Therefore, the intensity of the plasma in the vicinity of the end face 11h of the guide bush 11 is greater than that of the plasma in the vicinity of other portions of the guide bush 11 and is unstable.

Furthermore, a portion of the guide bush 11 around the end portion is subject to the influence of both the plasma produced outside the guide bush 11 and that produced inside the guide bush 11.

When a hard carbon film is formed under such conditions, the adhesion and quality of a portion of the hard carbon film formed on a portion of the inner surface in a range of several millimeters from the end face of the guide bush differ slightly from those of a portion of the same formed on other portions of the inner surface of the guide bush 11.

When the dummy member 53 is put on the end face 11h of the guide bush 11 as shown in FIG. 20 during the hard carbon film forming process, the portion of the hard carbon film having adhesion and quality different from those of a portion of the same formed on other portions of the inner surface of the guide bush 11 is not formed on the inner surface of the guide bush 11 and is formed on the inner surface of the dummy member 53.

Experiments showed that a hard carbon film of a width in the range of 1 to 2 mm having adhesion and quality slightly different from those of a hard carbon film formed in other portions of the inner surface of the guide bush 11 was formed at a depth of about 4 mm from the end face of the guide bush 11 when the hard carbon film was formed by the hard carbon film forming method illustrated in FIG. 10.

As shown in FIG. 20, when the dummy member 53 of 10 mm in length and an inside diameter substantially equal to that of the bore of the guide bush 11 was put on the end face 11h of the guide bush 11 and the hard carbon film forming method was carried out under the foregoing conditions, a portion of the hard carbon film having an adhesion and quality different from other portions of the hard carbon film which was formed over the inner surface of the dummy member 53 and any such portion was not formed on the inner surface of the guide bush 11 at all.

Figure 22:
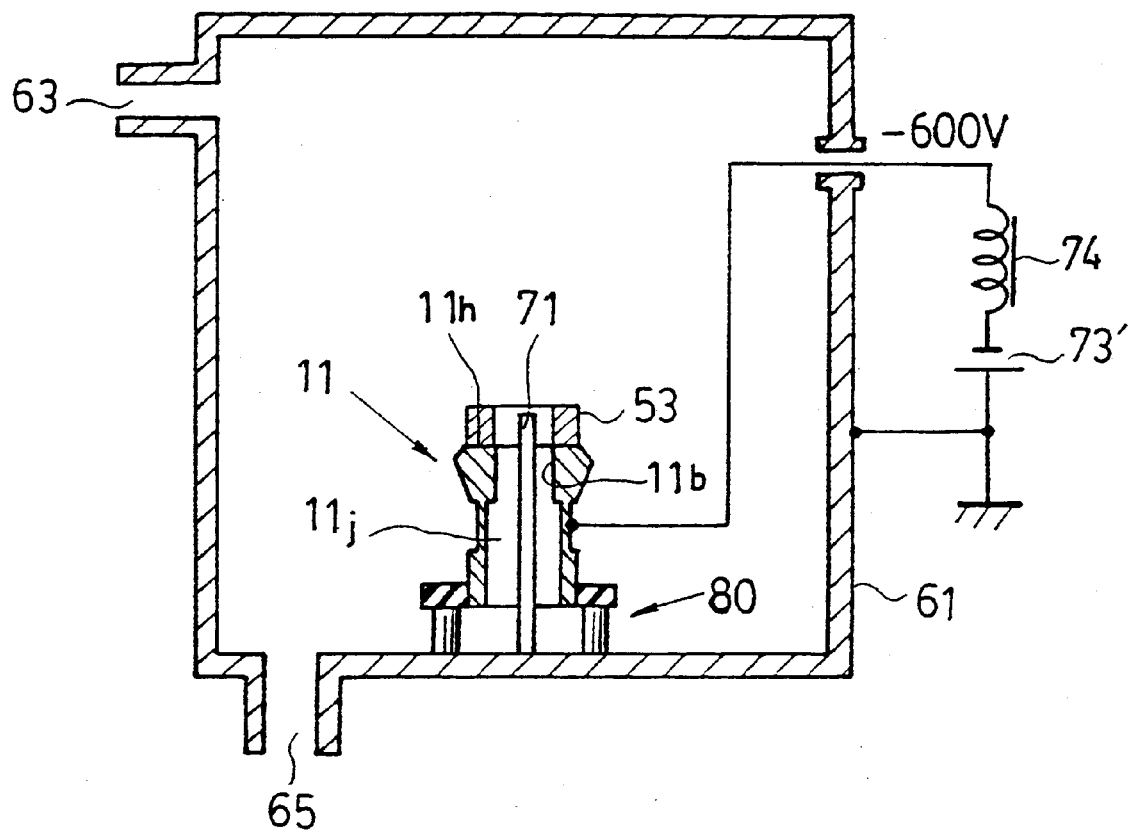
FIG. 22 is schematic sectional view of an apparatus like FIG. 15 for explaining another embodiment of a method of forming a hard carbon film over the inner surface of the guide bush using a dummy member.

Eleventh Embodiment: FIG. 22

A method of forming a hard carbon film over the inner surface of the guide bush according to the eleventh embodiment of the invention will now be described with reference to FIG. 22.

In FIG. 22, components which are the same as those shown in FIG. 15 are denoted by the same numerals, and the explanation thereof is omitted.

In the eleventh embodiment, the vacuum vessel 61 not provided with the anode 79 and the filament 78 is used similarly to the fifth embodiment shown in FIG. 15 to form the hard carbon film while the dummy member is placed on the end face 11h of the guide bush 11.

The eleventh embodiment achieves the same effect as the tenth embodiment.

Other Embodiments

In the method of forming hard carbon films at the same time over the inner surface 11b by disposing a plurality of guide bushes in the vacuum vessel in the manner set forth above, the dummy member 53 may be placed on each end face 11h of each guide bush to form the hard carbon film over each of the inner surfaces 11b.

Although each of the above embodiments describes the case where the hard carbon film is formed on each inner surface of the single or two guide bushes disposed in the single vacuum vessel, the hard carbon film may be formed at the same time over each inner surface of three or more guide bushes disposed in the vacuum vessel.

Further, any of the above embodiments may comprise a process of forming an intermediate layer over the inner surface 11b of the guide bush for enhancing the adhesion to the hard carbon film by the method explained with reference to FIG. 9 before the guide bush is disposed in the vacuum vessel for forming the hard carbon film. In this case, the hard carbon film is formed on the intermediate layer over the inner surface 11b of the guide bush 11 in the step of forming the hard carbon film with a plasma CVD method in each embodiment set forth above.

Although the foregoing hard carbon film forming methods embodying the present invention use methane ($CH_4$) gas or benzene ($C_6H_6$) gas as a gas containing carbon, the hard carbon film forming methods may use ethylene ($C_2H_4$), hexane ($C_6H_{14}$) or the like.

These gases containing carbon may be diluted by an inert gas that is ionized at a relatively low ionization potential, such as argon (Ar) to stabilize the plasma produced in the center bore of the guide bush.

A small amount of an additive (1% or less) may be added to the gas containing carbon for forming the hard carbon film to enhance lubricity or hardness.

Addition of, for example, fluorine (F) or boron (B) to the gas containing carbon increases lubricity. Addition of, for example, chromium (Cr), molybdenum (Mo) or tungsten (W) to the gas containing carbon increases hardness.

It is desirable to produce a plasma of argon (Ar) or nitrogen ($N_2$) after placing the guide bush in the vacuum vessel prior to forming the hard carbon film to bombard the inner surface of the guide bush, and to produce a plasma of the gas containing carbon, such as methane gas or benzene gas, for forming the hard carbon film.

This pretreatment using bombardment with an inert gas increases the temperature of the inner surface of the guide bush, activates the inner surface and drives out impurities from the inner surface of the guide bush to clean the inner surface. These effects further improve the adhesion of the hard carbon film to the inner surface of the hard carbon film.

What is claimed is:

1. A method of forming a diamond-like carbon (DLC) film over the inner surface of a guide bush which is formed substantially in a cylindrical shape and having a center bore in its axial direction, and further includes a taper outer surface, an inner surface to be in sliding contact with a workpiece, and slits provided at one end thereof, and which holds the workpiece inserted into the center bore rotatably and slidably in the axial direction near a cutting tool when the guide bush is mounted on an automatic lathe, wherein the guide bush is disposed in a vacuum vessel provided with a gas inlet port, an evacuation port, an anode and a filament;

an auxiliary electrode is inserted into the center bore forming the inner surface of the guide bush, to be at a ground potential, a gas containing carbon is introduced into the vacuum vessel through the gas inlet port after evacuating the vacuum vessel; and a DC voltage is applied to the guide bush through a reactor, and a DC voltage is applied to the anode and an AC voltage is applied to the filament, thereby producing a plasma in the vacuum vessel so that a diamondlike carbon (DLC) film of hydrogenated amorphous carbon is formed over the inner surface of the guide bush with a plasma CVD method.

2. A method of forming a diamond-like carbon (DLC) film over the inner surface of a guide bush which is formed substantially in a cylindrical shape and having a center bore in its axial direction, and further includes a taper outer surface, an inner surface to be in sliding contact with a workpiece, and slits provided at one end thereof, and which holds the workpiece inserted into the center bore rotatably and slidably in the axial direction near a cutting tool when the guide bush is mounted on an automatic lathe, wherein the guide bush is disposed in a vacuum vessel provided with a gas inlet port and an evacuation port;

an auxiliary electrode is inserted into the center bore forming the inner surface of the guide bush to be at a ground potential;

a gas containing carbon is introduced into the vacuum vessel through the gas inlet port after evacuating the vacuum vessel; and a DC voltage is applied to the guide bush through a reactor to produce a plasma in the vacuum vessel so that a diamond-like carbon (DLC) film of hydrogenated amorphous carbon is formed over the inner surface of the guide bush with a plasma CVD method.

3. A method of forming a diamond-like carbon (DLC) film over the inner surface of the guide bush according to claim 1, further including:

a step of forming an intermediate layer over the inner surface of the guide bush for enhancing adhesion to the diamond-like carbon (DLC) film before disposing the guide bush in the vacuum vessel;

wherein the diamond-like carbon (DLC) film is formed on the intermediate layer over the inner surface of the guide bush in the step of forming the diamond-like carbon (DLC) film by the plasma CVD method.

4. A method of forming a diamond-like carbon (DLC) film over the inner surface of the guide bush according to claim 2, further including:

a step of forming an intermediate layer over the inner surface of the guide bush for enhancing adhesion to the diamond-like carbon (DLC) film before disposing the guide bush in the vacuum vessel;

wherein the diamond-like carbon (DLC) film is formed on the intermediate layer over the inner surface of the guide bush in the step of forming the diamond-like carbon (DLC) film by the plasma CVD method.

5. A method of forming a diamond-like carbon (DLC) film over the inner surface of the guide bush according to claim 1, further including:

disposing a plurality of guide bushes in the vacuum vessel;

inserting auxiliary electrodes into the center bores of each guide bush to permit each auxiliary electrode to be at a ground potential; and applying a DC voltage to each guide bush through a single reactor.

6. A method of forming a diamond-like carbon (DLC) film over the inner surface of the guide bush according to claim 2, further including:

disposing a plurality of guide bushes in the vacuum vessel;

inserting auxiliary electrodes into the center bores of each guide bush to permit each auxiliary electrode to be at a ground potential; and applying a DC voltage to each guide bush through a single reactor.

7. A method of forming a diamond-like carbon (DLC) film over the inner surface of the guide bush according to claim 5, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

8. A method of forming a diamond-like carbon (DLC) film over the inner surface of the guide bush according to claim 6, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

9. A method of forming a diamond-like carbon (DLC) film over the inner surface of the guide bush according to claim 1, further including:

disposing a plurality of guide bushes in the vacuum vessel;

inserting auxiliary electrodes into the center bores of each guide bush to permit each auxiliary electrode to be at a ground potential; and applying a DC voltage to each guide bush from respective individual power sources through individual reactors.

10. A method of forming a diamond-like carbon (DLC) film over the inner surface of the guide bush according to claim 2, further including:

disposing a plurality of guide bushes in the vacuum vessel;

inserting auxiliary electrodes into the center bores of each guide bush to permit each auxiliary electrode to be at a ground potential; and applying a DC voltage to each guide bush from respective individual power sources through individual reactors.

11. A method of forming a diamond-like carbon (DLC) film over the inner surface of the guide bush according to claim 9, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

12. A method of forming a diamond-like carbon (DLC) film over the inner surface of the guide bush according to claim 10, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

13. A method of forming a diamond-like carbon (DLC) film over the inner surface of the guide bush according to claim 1, further including:

disposing a plurality of guide bushes in the vacuum vessel;

inserting auxiliary electrodes into the center bores of each guide bush to permit each auxiliary electrode to be at a ground potential; and applying a DC voltage to each guide bush from respective common power sources through individual reactors.

14. A method of forming a diamond-like carbon (DLC) film over the inner surface of the guide bush according to claim 2, further including:

disposing a plurality of guide bushes in the vacuum vessel;

inserting auxiliary electrodes into the center bores of each guide bush to permit each auxiliary electrode to be at a ground potential; and applying a DC voltage to each guide bush from respective common power sources through individual reactors.

15. A method of forming a diamond-like carbon (DLC) film over the inner surface of the guide bush according to claim 13, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

16. A method of forming a diamond-like carbon (DLC) film over the inner surface of the guide bush according to claim 14, further including:

a step of forming an intermediate layer over the inner surface of each guide bush for enhancing adhesion to the diamond-like carbon (DLC) film before disposing each guide bush in the vacuum vessel;

wherein the diamond-like carbon (DLC) films are respectively formed on the intermediate layer over the inner surface of each guide bush in the step of forming the diamond-like carbon (DLC) film by the plasma CVD method.

* * * * *